(12) United States Patent
Tanaka et al.

(10) Patent No.: US 11,183,619 B2
(45) Date of Patent: Nov. 23, 2021

(54) METHOD OF MANUFACTURING LIGHT EMITTING DEVICE

(71) Applicant: NICHIA CORPORATION, Anan (JP)

(72) Inventors: Hiroyuki Tanaka, Tokushima (JP); Yasuo Kato, Anan (JP); Kazuya Matsuda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/698,324

(22) Filed: Nov. 27, 2019

(65) Prior Publication Data
US 2020/0176649 A1   Jun. 4, 2020

(30) Foreign Application Priority Data

Nov. 30, 2018   (JP) .............................. JP2018-224393

(51) Int. Cl.
*H01L 33/56*   (2010.01)
*H01L 33/62*   (2010.01)
(Continued)

(52) U.S. Cl.
CPC .............. *H01L 33/56* (2013.01); *H01L 33/54* (2013.01); *H01L 33/62* (2013.01); *H01L 33/60* (2013.01);
(Continued)

(58) Field of Classification Search
CPC ...................... H01L 33/62; H01L 33/60; H01L 2224/48257; H01L 2224/48247; H01L 24/97; H01L 2933/0066
See application file for complete search history.

(56) References Cited

U.S. PATENT DOCUMENTS

2006/0127690 A1 * 6/2006 Ueda .................. H05K 3/06
428/596
2012/0132949 A1   5/2012 Watari et al.
(Continued)

FOREIGN PATENT DOCUMENTS

JP   1-261852 A   10/1989
JP   6-151674 A   5/1994
(Continued)

OTHER PUBLICATIONS

Shin-EtsumicroSI, "the Difference Between Positive and Negative Photoresist," Mar. 5, 2013 (Year: 2013).*

*Primary Examiner* — Marcos D. Pizarro
*Assistant Examiner* — Antonio B Crite
(74) *Attorney, Agent, or Firm* — Birch, Stewart, Kolasch & Birch, LLP.

(57) ABSTRACT

A method of manufacturing a light emitting device, including: providing a first structure including: providing a lead frame which includes providing a metal plate including a plurality of pairs of first and second metal parts, each metal part including an upper surface, a lower surface, and an end surface, the end surface of the first metal part and the end surface of the second metal part of each pair are opposite to each other, and a first region including the end surface, and disposing a mask of a resist film on the first region using an electrodeposition technique, disposing a first plated layer containing gold or gold alloy on a second region including the upper surface other than the first region on at least one of the upper surface, the lower surface, and the end surface of each of the first and second metal parts using a plating technique, and removing the resist film, providing a resin molded body molded integrally with the lead frame with parts of a lower surface of the lead frame being exposed, in which the first structure includes an upper surface defining a plurality of recesses each having an upward-facing surface, (Continued)

the first plated layer on the upper surface of the metal part is located at the upward-facing surface of each of the plurality of recesses; providing a second structure, the providing a second structure including; disposing at least one light-emitting element on the upward-facing surface each of the plurality of recesses, disposing a sealing member covering the at least one light-emitting element in each of the plurality of recesses; and separating the second structure into a plurality of discrete light emitting devices.

20 Claims, 23 Drawing Sheets

(51) Int. Cl.
    *H01L 33/54*     (2010.01)
    *H01L 33/60*     (2010.01)
    *H01L 33/48*     (2010.01)

(52) U.S. Cl.
    CPC   *H01L 2933/005* (2013.01); *H01L 2933/0066* (2013.01)

(56) References Cited

U.S. PATENT DOCUMENTS

| | | | |
|---|---|---|---|
| 2012/0313131 | A1* | 12/2012 | Oda .................... H01L 21/4828 257/98 |
| 2013/0307000 | A1* | 11/2013 | Ikenaga ................ H01L 33/486 257/91 |

FOREIGN PATENT DOCUMENTS

| | | | | |
|---|---|---|---|---|
| JP | 6-291232 A | | 10/1994 | |
| JP | 7-302871 A | | 11/1995 | |
| JP | 2006-93559 A | | 4/2006 | |
| JP | 2011-129687 A | | 6/2011 | |
| JP | 2011129687 A | * | 6/2011 | |
| JP | 2012-114286 A | | 6/2012 | |
| JP | 2013-145862 A | | 7/2013 | |
| JP | 2013145862 A | * | 7/2013 | ............. H01L 24/97 |
| JP | 2013-207036 A | | 10/2013 | |
| JP | 2014-207481 A | | 10/2014 | |
| JP | 2015-126169 A | | 7/2015 | |
| JP | 2016-26398 A | | 2/2016 | |
| JP | 2017-76809 A | | 4/2017 | |

\* cited by examiner

FIG. 7

| | Manufacturing condition | | | | | | Evaluation result | |
|---|---|---|---|---|---|---|---|---|
| | Metal plate type | Lower metal layer | Upper metal layer | First plated layer | Resist film forming method | First plated layer formation region | Entry of solder | Leakage of sealing member |
| Example 1 | Copper alloy 194 | Ni | Pd | Au | Electrodeposition | FIG. 6B | None | None |
| Example 2 | Copper alloy 194 | Ni | Pd | Au-Ag alloy | Electrodeposition | FIG. 6B | None | None |
| Example 3 | Copper alloy 194 | Ni | Pd-Ni alloy | Au | Electrodeposition | FIG. 6C | None | None |
| Example 4 | Copper alloy 194 | Ni | Pd | Au | Electrodeposition | FIG. 6C | None | None |
| Example 5 | Copper alloy 194 | Ni | Rh-Pt alloy | Au | Electrodeposition | FIG. 6C | None | None |
| Example 6 | Copper alloy 194 | Ni-Co alloy | Pd | Au | Electrodeposition | FIG. 6D | None | None |
| Example 7 | Copper alloy 194 | Ni | Pd | Au | Electrodeposition | FIG. 6D | None | None |
| Comparative Example 1 | Copper alloy 194 | Ni | Pd | Au | None | Entire surfaces | Observed | Observed |
| Comparative Example 2 | Copper alloy 194 | Ni | Pd | Au | Dry film | FIG. 6A | Observed | Observed |

METHOD OF MANUFACTURING LIGHT EMITTING DEVICE

CROSS-REFERENCE TO RELATED PATENT APPLICATION

This application claims priority to Japanese Patent Application No. 2018-224393, filed on Nov. 30, 2018, the entire disclosures of which are incorporated herein by references in their entirety.

BACKGROUND

1. Technical Field

The present disclosure relates to a method of manufacturing a light emitting device.

2. Description of Related Art

Japanese Unexamined Patent Application Publication No. 2017-076809 A describes a method of manufacturing a light emitting device in which the entirety of outermost surfaces of a lead frame is plated with gold and subsequently a reflective resin part is formed on the lead frame.

Japanese Unexamined Patent Application Publication No. 2011-129687 A describes a method of manufacturing a light emitting device in which a photoresist is applied to a front surface and a back surface of a metal substrate, and a plating member is partially formed.

SUMMARY

In the method of manufacturing a light emitting device described in JP 2017-076809 A, adhesion between the lead frame and the reflective resin part may be reduced attributed to poor adhesion between gold, which has high resistance to oxidation, and the reflective resin part.

In the method of manufacturing a light emitting device described in JP 2011-129687 A, it is difficult to surely apply the photoresist to the corners or the lateral surfaces of the metal substrate. For example, the photoresist may fail to be formed at the corners or near the corners of the metal substrate.

One object of certain embodiments of the present disclosure is to provide a method of manufacturing a light emitting device in which a resist film is formed at a desired location and reduction in adhesion between a lead frame (a lead part) and a resin part is reduced.

A method of manufacturing a light emitting device according to one embodiment of the present disclosure a light emitting devices includes: providing a first structure having a lead frame and a resin molded body which includes the following steps: providing a metal plate including a plurality of pairs of first and second metal parts, each of the first and second metal parts including an upper surface, a lower surface, an end surface, and a first region including the end surface, wherein the end surface of the first metal part and the end surface of the second metal part of each pair oppose each other, disposing a mask of a resist film on the first region by using an electrodeposition technique, using a plating technique to dispose a first plated layer containing gold or gold alloy on a second region which includes the upper surface other than the first region, and on at least one of the upper surface, the lower surface, and the end surface of each of the first and second metal parts, and removing the resist film to product the lead frame, and providing a resin molded body molded integrally with the lead frame with parts of a lower surface of the lead frame being exposed, wherein, the first structure includes an upper surface defining a plurality of recesses each having an upward-facing surface, the first plated layer on the upper surface of the metal part is located at the upward-facing surface of each of the plurality of recesses; providing a second structure having at least one light-emitting element and sealing member which includes the following steps: disposing at least one light-emitting element on the upward-facing surface each of the plurality of recesses, disposing a sealing member covering the at least one light-emitting element in each of the plurality of recesses; and separating the second structure into a plurality of discrete light emitting devices.

Certain embodiments of the present disclosure allow for obtaining a method of manufacturing a light emitting device in which a resist film is formed at a desired location and reduction of adhesion between a lead frame (a lead part) and a resin part is reduced.

BRIEF DESCRIPTION OF THE DRAWINGS

FIG. 7 is a table showing evaluation results and measurement results of Examples 1 to 7, Comparative examples 1 and 2.

DETAILED DESCRIPTION OF EMBODIMENT

Figure 1A:
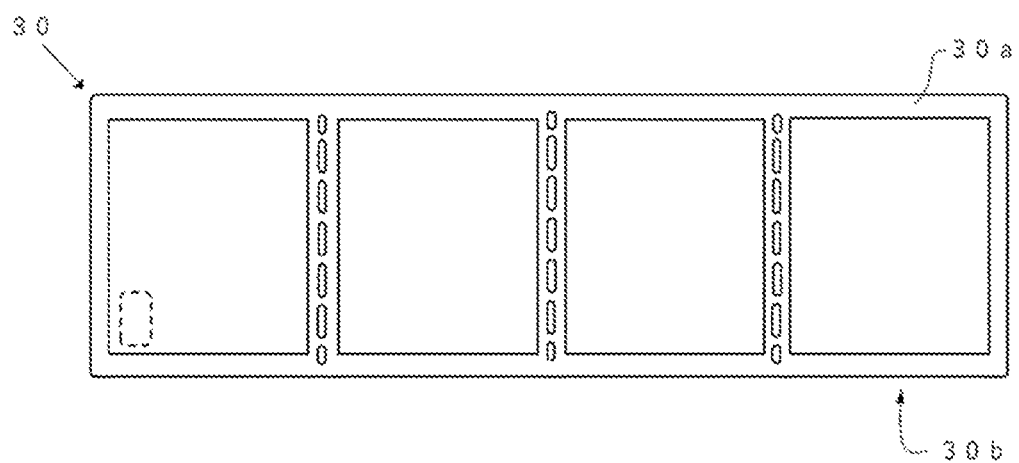
FIG. 1A is a schematic top view of a metal plate according to a first embodiment.

With reference to the drawings, certain embodiments of the present disclosure will be described below. The embodiments described below are examples, and a method of manufacturing a light emitting device of the present disclosure is not limited to the embodiments below. For example, values, shapes, and materials in the embodiments below are examples, and various changes may be made unless any technical contradiction arises.

The dimension, the positional relationship or the like of components in the drawings may be exaggerated for easier understanding and may not reflect the sizes, or the positional relationship between the components in the actual light-emitting module. In order to avoid excessive complexity in the drawings, illustration of some elements may be omitted.

In the description below, components having substantially having the same function are denoted by an identical reference character, and repetitive explanation thereof may not be given. In the description below, terms indicating a direction or position (e.g., "above", "below", "right", "left", or other terms similar to such terms) may be used. Such terms will be used for easier understanding of the relative directions and positions in the drawings referred to. The relative relationships of directions or positions in referenced drawings, as indicated by terms such as "above", "below", "right", "left", etc., may be the same as those in drawings other than those of the present disclosure, in products, or the like, while arrangements of components in the referenced drawings may not be the same as arrangements of corresponding components in drawings other than those of the present disclosure, in products, manufacturing device, or the like.

In the present specification, terms such as a metal part and a lead part may be used both before and after separation into a plurality of discrete light emitting devices.

A method of manufacturing a light emitting device 100 according to a first embodiment of the present disclosure includes: providing a first structure 50; providing a second structure 60; and separating the second structure 60 into a plurality of discrete light emitting devices 100. The providing the first structure 50 includes: (A) providing a metal plate 30; (B) providing a lead frame 40 provided with a first plated layer 5 containing gold or gold alloy at a desired region; and (C) providing a resin molded body 8 on the lead frame 40.

These operations will be described in detail with reference to FIGS. 1A to 5D.

(A) Providing Metal Plate 30

Figure 1B:
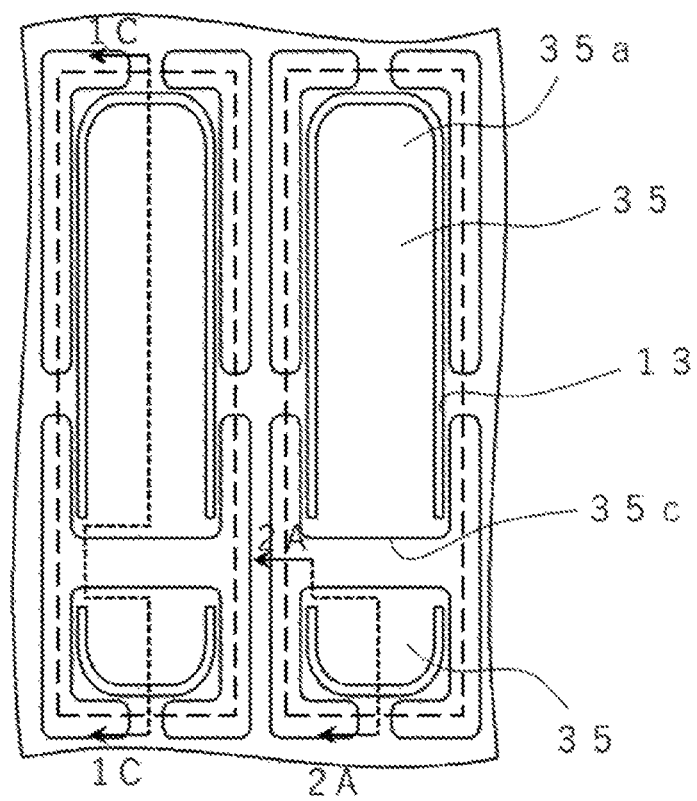
FIG. 1B is a partial enlarged view of a portion encircled by a broken line in FIG. 1A.
Figure 1C:
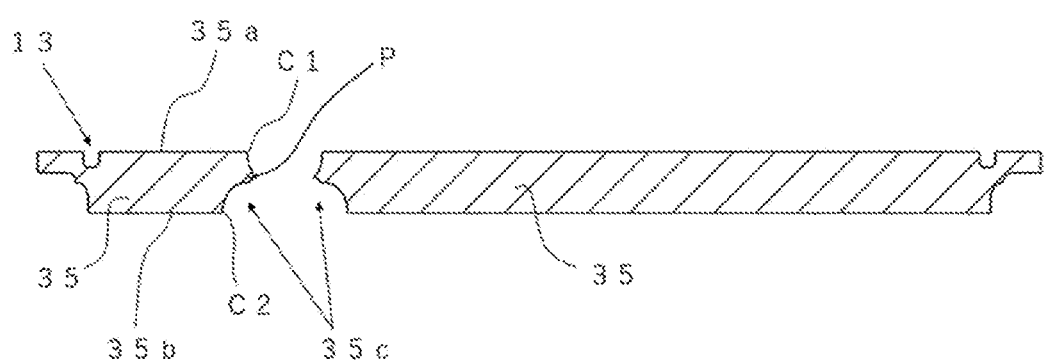
FIG. 1C is a schematic cross-sectional view taken along line 1C-1C in FIG. 1B.

A metal plate 30 is provided, which includes a plurality of pairs of metal parts 35, each metal part 35 including an upper surface 30a, a lower surface 30b, and an end surface 35c that faces the other metal part 35 of a respective pair of the metal parts 35. The metal plate 30 may be provided by purchasing a manufactured metal plate 30, or by manufacturing in which a flat plate-like member made of copper, copper alloy, or nickel alloy is subjected to etching or pressing. FIG. 1A is a schematic top view of the metal plate 30. FIG. 1B is a partial enlarged view of a portion encircled by a broken line in FIG. 1A (showing two pairs of metal parts 35). FIG. 1C is a schematic cross-sectional view taken along line 1C-1C in FIG. 1B. In the present specification, the term "first end surface 35c" refers to a surface of each of the metal parts 35 between the upper surface 35a and the lower surface 35b located such that the end surfaces 35c of each pair of metal members 35 face each other.

Each of the metal parts 35 shown in FIG. 1C includes a first corner portion C1 connecting the upper surface 35a and the first end surface 35c of the metal part 35, and a second corner portion C2 connecting the lower surface 35b and the first end surface 35c of the metal part 35. In the present specification, the first and second corner portions C1 and C2 may partially include a curved portion. Each pair of metal parts 35 includes a first metal part 35 and a second metal part 35. In each pair of the metal parts 35, the first corner portion C1 of the first metal part 35 is positioned closer to the second metal part 35 than the second corner portion C2 is. The first end surface 35c of each metal part 35 includes a projection P which is positioned closer to the second metal part 35 than the first corner portion C1 and the second corner portion C2 are. With the first end surface 35c including the projection P, the surface area of the first end surface 35c can be increased easily as compared to the case in which the first end surface 35c are perpendicular to the upper surface 35a. This allows for increasing adhesion strength to a resin molded body 8 which will be described below.

As shown in FIG. 1B, each metal part 35 may include a groove 13 or a through hole at the upper surface 35a. This allows the resin molded body 8 to enter the groove 13 or the through hole, so that the pair of metal parts 35 (the portions to be a pair of lead parts 36) and the resin molded body 8 are strongly bonded to each other. The forming of the groove 13 or the through hole may be performed simultaneously with or separately from providing of the pair of metal parts 35.

(B) Providing Lead Frame 40

Figure 2A:
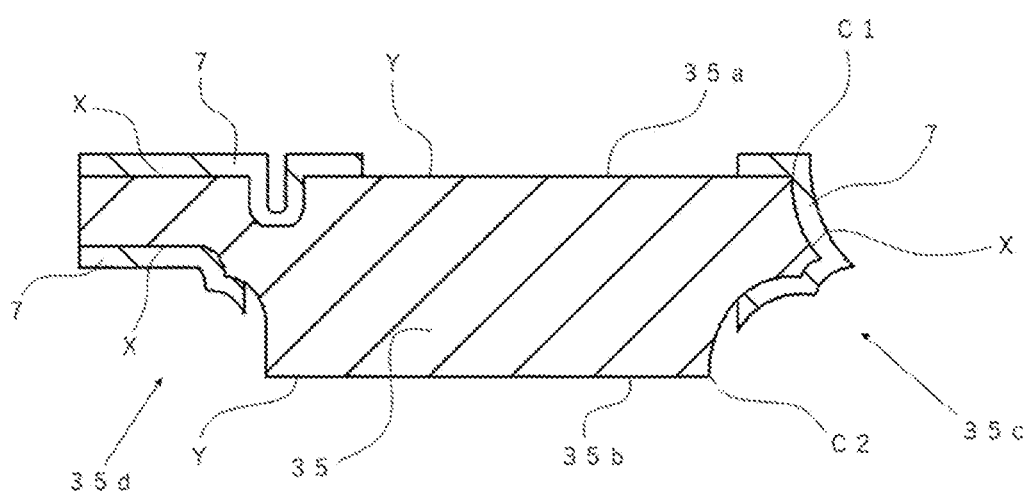
FIG. 2A is a schematic cross-sectional view of a metal part after disposing a resist film on a first region.

Next, a resist film 7 is disposed in a first region X including the first end surface 35c of each metal part 35 by electrodeposition. FIG. 2A is a schematic cross-sectional view taken along line 2A-2A in FIG. 1B, and shows the metal part 35 provided with the resist film 7 at the first region X. In FIG. 2A, the resist film 7 continuously covers an upper region of the first end surface 35c and a portion of the upper surface 35a connected to the upper region of the first end surface 35c. The resist film 7 also covers an upper region of a second end surface 35d positioned opposite to the first end surface 35c, and a portion of the upper surface 35a. The resist film 7 may cover a portion of the first end surface 35c, or the entirety of the first end surface 35c. Furthermore, the resist film 7 preferably covers, continuously from the first end surface 35c of the metal part 35, at least one of the first corner portion C1 connecting the upper surface 35a and the first end surface 35c of the metal part 35, and the second corner portion C2 connecting the lower surface 35b and the first end surface 35c of the metal part 35. Thus, when the resist film 7 is removed, the first plated layer 5 containing gold or gold alloy is not formed on the region covered by the resist film 7. This allows for improving adhesion strength between the metal part 35 and the resin molded body 8 which will be described below.

Providing the resist film 7 at the first region X of the metal part 35 includes, for example, the following steps.

(B-1) Disposing Resist Film 7 Using Electrodeposition

Figure 2B:
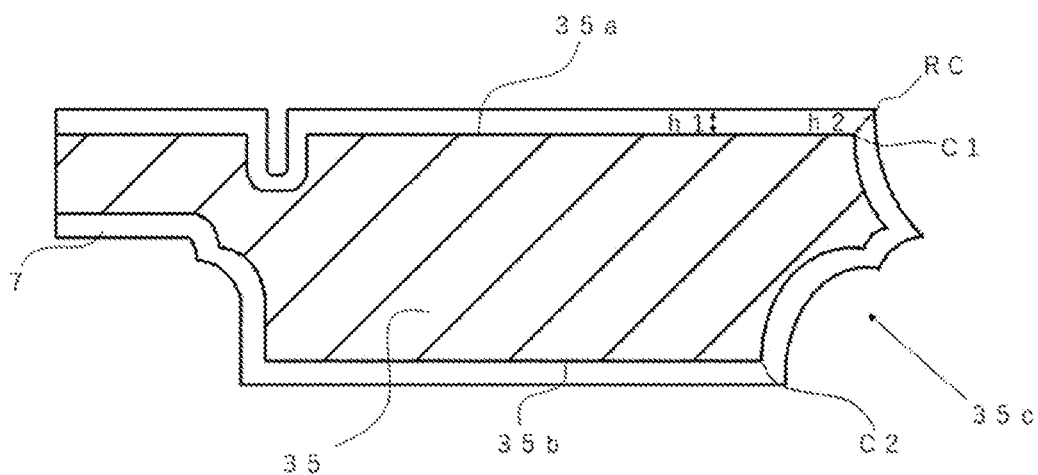
FIG. 2B is a schematic cross-sectional view of the metal part on which the resist film is disposed.

The metal plate 30 is immersed in an aqueous solution containing a substance to be charged particles (for example, acrylic) and a substance to be the resist film 7, and electricity is supplied. This step is performed, for example, at a voltage in a range of 100 V to 250 V and for an immersion time in a range of 10 seconds to 30 seconds, preferably, at a voltage in a range of 150 V to 200 V and for an immersion time in a range of 10 seconds to 20 seconds. Thus, as shown in FIG. 2B, the resist film 7 is disposed on surfaces of the metal part 35 including the upper surface 35a, the lower surface 35b, the first end surface 35c, and the corner portions. In FIG. 2B, for the sake of clarity, the resist film 7 is not hatched. For the resist film 7, a photosensitive photoresist material is preferably used. When using a photoresist material for the resist film 7, a desired region is irradiated with light and an unnecessary portion is removed using a developer solution, so that the resist film 7 is precisely obtained.

(B-2) Drying Resist Film 7

Next, the metal plate 30 is taken out from the aqueous solution, and the resist film 7 is heated to be dried. The metal plate 30 provided with the resist film 7 is heated, for example at a temperature in a range of 60° C. to 100° C. for a time in a range of 45 seconds to 90 seconds inclusive, suitably at a temperature in a range of 60° C. to 80° C. for a time in a range of 60 seconds to 90 seconds. Accordingly, the resist film 7 with reduced variations in thickness on the surfaces of the metal plate 30. Further, by the drying, a component of the resist film 7 is effectively attach to the corner portions and its vicinity of the metal part 35, so that the resist film 7 easily covers the corner portions of the metal part 35.

When using a conventional method in which the resist film 7 is formed by applying, it is not easy to surely cover the corner portions and/or the end surface of the metal part 35 by the resist film 7. Meanwhile, according to the method of manufacturing a light emitting device of the present disclosure, forming the resist film 7 by electrodeposition allows for facilitating formation of the resist film 7 on a desired region of the metal part 35 including the corner portions and the first end surface 35c.

In the conventional method of forming the resist film 7 by applying, the resist film 7 at the corner portions of the metal part 35 tends to have a thickness smaller than a thickness of the metal part 35 on the upper surface 35a and the lower surface 35b of the metal part 35. Meanwhile, according to the method of manufacturing a light emitting device of the present disclosure, forming the resist film 7 by electrodeposition allows for reducing difference between a thickness of the resist film 7 on the corner portions of the metal part 35 and a thickness of the resist film on the upper surface 35a and the lower surface 35b of the metal part 35. This allows for preventing unintentional formation of the first plated layer containing gold or gold alloy at the corner portions of the metal part 35. The difference between a thickness h1 of the resist film formed at the upper surface 35a of the metal part 35 and a thickness h2 of the resist film 7 formed at the first corner portion C1 or the second corner portion C2 of the metal part 35 is in a range of, for example, 0 μm to 30 μm, preferably 0 μm to 5 μm. This allows for reducing possibility of insufficient curing of the resist film 7 in exposing which will be described below. This also facilitates removing of the resist film 7 which will be described below. The thickness h2 of the resist film 7 formed at the first corner portion C1 or the second corner portion C2 of the metal part 35 refers to the distance between the first corner portion C1 or the second corner portion C2 of the metal part 35 and a corner portion RC of the resist film 7.

The thickness of the resist film 7 formed on the corresponding surfaces of the metal plate 30 is, for example, 20 μm or less, and preferably 10 μm or less. The thickness of the resist film 7 being 20 μm or less effectively reducing variations in thickness of the resist film 7. Also, the thickness of the resist film 7 being 20 μm or less allows for facilitating removing of the resist film 7. The thickness of the resist film 7 may be greater than 20 μm.

(B-3) Removing a Portion of Resist Film 7 Other than First Region X

Next, a portion of the resist film 7 other than the first region X is removed. This step of removing includes, for example, exposing, in which a desired region on the surface of the metal part 35 is irradiated with light, and removing an unnecessary portion of the resist film 7 using a developer solution (that is, developing).

When a negative photoresist material is used for the resist film 7, the exposing is carried out such that a portion of the resist film 7 in the first region X is irradiated with light emitted from above, beneath, or above and beneath the metal plate 30, to render the portion of the resist film 7 in the first region X insoluble in the developer solution. Next, the metal plate 30 is immersed in the developer solution, or the developer solution is sprayed onto the surface of the metal plate 30. Thus, in the resist film 7 on the surfaces of the metal part 35, the portion of the resist film 7 in a second region Y, which is the region other than the first region X, is removed using the developer solution. In order to improve adhesion between the resist film 7 and the metal part 35, heating may be performed after the developing. Through these steps, as shown in FIG. 2A, the metal plate 30 provided with the resist film 7 only in the first region X on the corresponding surfaces of the metal part 35 can be obtained.

When a positive photoresist material is used for the resist film 7, the exposing is carried out such that a portion of the resist film 7 in the second region Y, which is the region other than the first region X, is irradiated with light irradiated from above, beneath, or above and beneath the metal plate 30, to render the portion of the resist film 7 in the second region Y soluble in the developer solution. Next, the metal plate 30 is immersed in the developer or the developer is sprayed onto the surface of the metal plate 30. Thus, the portion of the resist film 7 on the surface of the metal part 35 in the second region Y is removed using the developer solution. In order to improve adhesion between the resist film 7 and the metal part 35, heating may be performed after the developing. Through these steps, as shown in FIG. 2A, the metal plate 30 provided with the resist film 7 only in the first region X on the corresponding surface of the metal part 35 can be obtained.

Figure 2C:
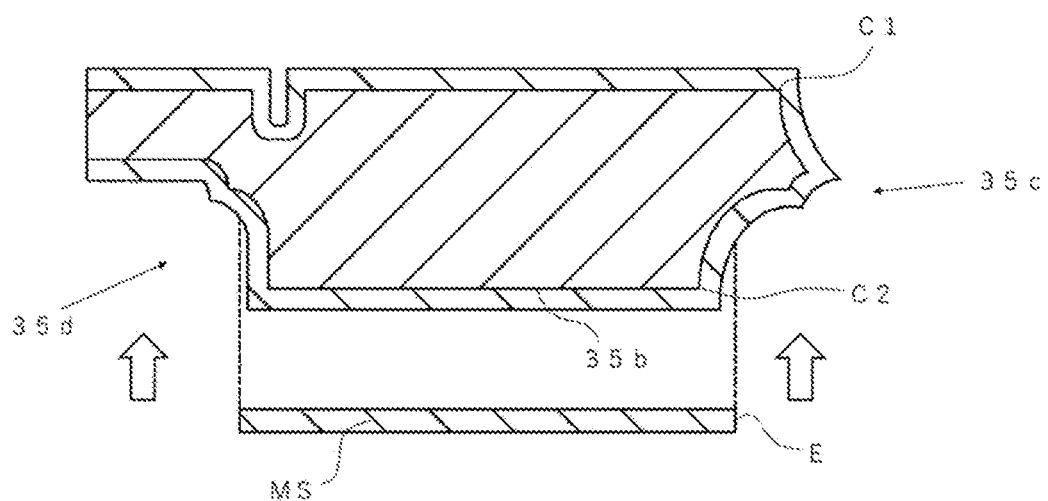
FIG. 2C is a schematic cross-sectional view showing one example of exposing.

The exposing may be performed such that, for example, a light-shielding mask is disposed and irradiating the metal plate 30 with light via the light-shielding mask. FIG. 2C shows the exposing in which a negative photoresist material and a light-shielding mask MS are used. FIG. 2C is a schematic cross-sectional view in a direction perpendicular to the upper surface of the metal part 35. In FIG. 2C, the first corner portion C1 is located outward of than the second corner portion C2 is. The light-shielding mask can be repeatedly used through cleaning. The exposing may be alternatively performed using an irradiation device which irradiates the metal plate 30 with predetermined patterning light. For the irradiation device may be, for example, a maskless exposure device, a direct imaging device, or a direct imaging exposure device may be employed.

In (B-3) removing the resist film 7 including the exposing, preferably the resist film 7 on the entirety of the lower surface of the metal part 35 is removed. Thus, in (B-4) disposing a first plated layer 5, which will be described below, the first plated layer 5 is formed over the entirety of the lower surface of the metal part 35. As a result, the first plated layer 5, which is less likely to be oxidized or sulfurized, is disposed in the lower surface of each of discrete light emitting devices 100. With such a structure, for example, in the light emitting device 100 mounted on a mounting substrate via a bonding member such as solder, reduction in bonding strength between the light emitting device 100 and the bonding member over time can be reduced.

The resist film 7 on the entirety of the lower surface of the metal part 35 may be removed by, for example, exposing which manner is shown in FIG. 2C. More specifically, when irradiating the resist film 7 with light from below the metal plate 30, the light-shielding mask MS is disposed so as to cover the lower surface of the metal part 35. Further, exposure is performed such that an end portion E of the light-shielding mask MS is positioned between the first corner portion C1 and the second corner portion C2 of the metal part 35. This allows for reducing irradiation with light of the lower surface 35b of the metal part 35 and part of the first end surface 35c continuous to the lower surface 35b, so that the portion of the resist film in that region can be prevented from becoming insoluble in the developer solution. As a result, the portion of the resist film 7 on the lower surface 35b of the metal part 35 and the part of the first end surface 35c continuous to the lower surface 35b is easily removed using the developer solution. This is similar for the portion of the resist film 7 on the second end surface 35d of the metal part 35 opposite to the first end surface 35c. In the exposing, when an irradiation device configured to irradiate the metal plate 30 with a patterned light, patterned into a predetermined pattern, is employed, exposure is performed such that an end portion of the patterned light is located between the first corner portion C1 and the second corner portion C2 of the metal part 35, so as to irradiate the portion outward of the end portion (on the first corner portion C1 side) with the patterned light.

Figure 2D:
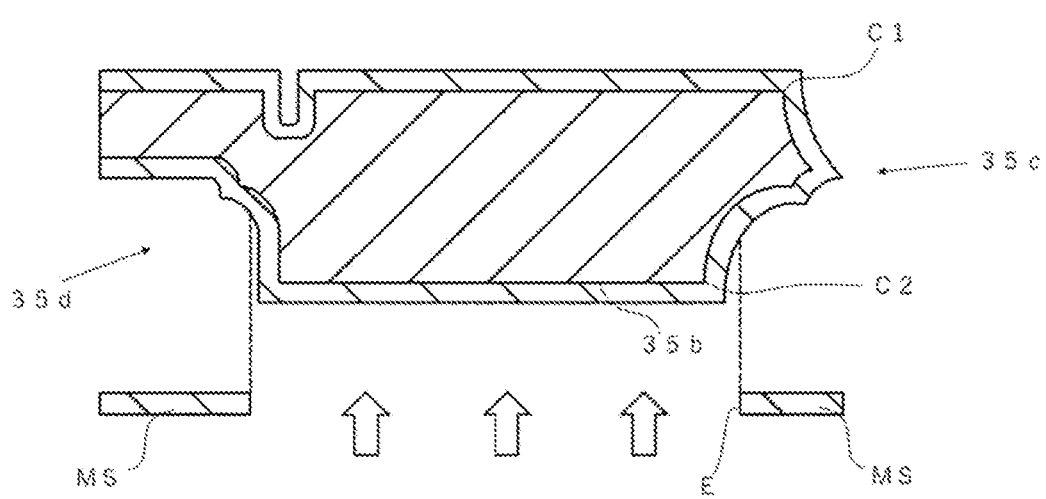
FIG. 2D is a schematic cross-sectional view showing another example of exposing.

When a positive photoresist material is used for the resist film 7, as shown in FIG. 2D, exposure is performed such that an end portion E of the light-shielding mask MS or the end portion of the patterned light of the irradiation device is located between the first corner portion C1 and the second corner portion C2 of the metal part 35, so as to irradiate the lower surface 35b of the metal part 35 and a portion of the first end surface 35c connected to the lower surface 35b with the patterned light. Thus, a portion of the resist film 7 positioned at the lower surface 35b of the metal part 35 and the part of the first end surface 35c connected to the lower surface 35b becomes soluble in the developer. As a result, the portion of the resist film 7 positioned at that region is easily removed using the developer solution.

A portion of the resist film 7 on the lower surface 35b may not be removed or may be partially removed. When the portion of the resist film 7 on the lower surface 35b is partially removed, for example, a portion of the resist film 7 in the central region, including the geometric center of the lower surface 35b, may be removed, such that the resist film 7 remains on a peripheral portion of the lower surface 35b. Alternatively, the resist film 7 at the periphery of the lower surface 35b may be removed, such that the resist film 7 remains in the central region including the geometric center of the lower surface 35b. Accordingly, the lower surface of the metal part 35 will be exposed, or a second plated layer 6, which will be described below, will be disposed on the lower surface of the metal part 35, so that the costs can be reduced as compared to the case where the first plated layer 5 is positioned on the lower surface of the metal part 35.

(B-4) Disposing First Plated Layer 5

Figure 2E:
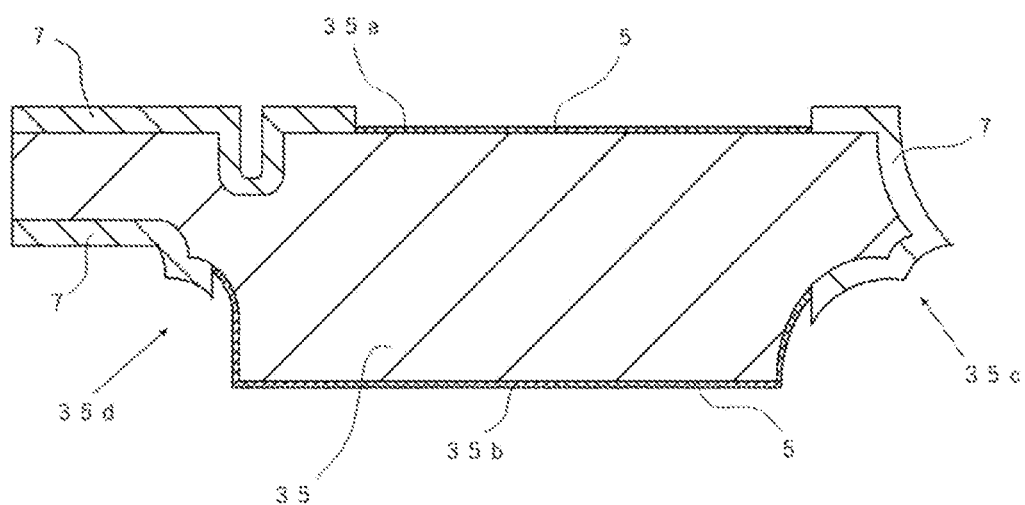
FIG. 2E is a schematic cross-sectional view showing disposing of a first plated layer.
Figure 2F:
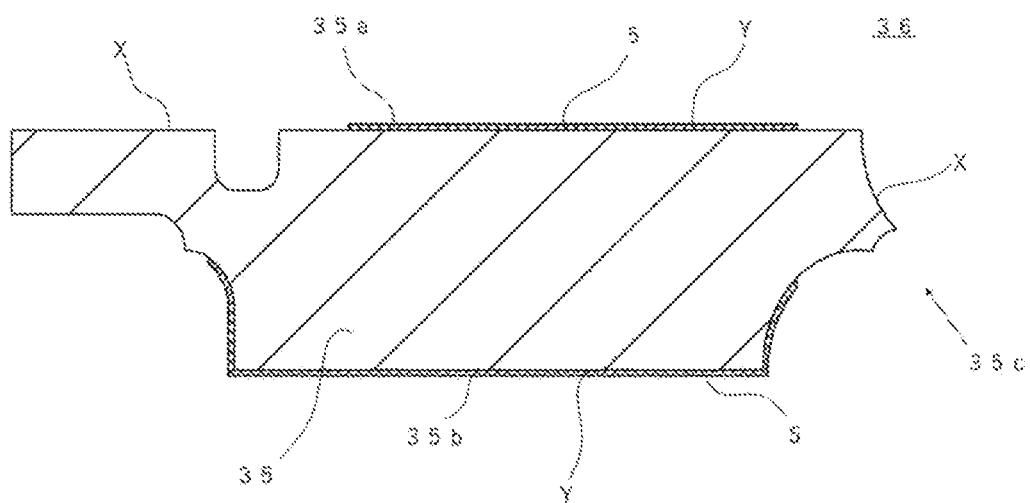
FIG. 2F is a schematic cross-sectional view showing removing of a resist film.

Next, using plating, the first plated layer 5 containing gold or gold alloy is disposed on the metal plate 30 provided with the resist film 7 in the first region X. The first plated layer 5 is a partially-plated layer. For the plating, electroplating or electroless plating may be employed. As shown in FIG. 2E, the first plated layer 5 is formed at least on the upper surface 35a of the metal part 35. As used herein, the expression "formed on the upper surface" encompasses both forming directly on the upper surface and forming indirectly above the upper surface via another plated layer. In other words, the first plated layer 5 may be in direct contact with the upper surface 35a of the metal part 35, or may be disposed above the metal part 35 without direct contact with the upper surface 35a of the metal part 35. When the second plated layer 6 is positioned between the first plated layer 5 and the upper surface 35a of the metal part 35, the first plated layer 5 is disposed above the metal part 35 via the second plated layer 6.

The first plated layer 5 shown in FIG. 2E is formed on the upper surface 35a side, the lower surface 35b side, the first end surface 35c side, and the second end surface 35d side opposite to the first end surface 35c of the metal part 35. With the first plated layer 5 containing gold or gold alloy and on the corresponding surfaces of the metal part 35, oxidization or sulfurization of the surface of the metal part 35 can be reduced. The thickness of the first plated layer 5 is, for example, 10 nm or more, preferably 20 nm or more, and further preferably 25 nm or more. This allows for facilitating, for example, mounting the light emitting element 10 on the first plated layer 5 or connecting one ends of wires.

The content of gold or gold alloy in the first plated layer 5 is, for example, 85 mass percent or more, preferably 90 mass percent or more. This allows for facilitating, for example, mounting the light emitting element 10 on the first plated layer 5 or connecting one ends of wires. When the first plated layer 5 is made of gold alloy, the gold alloy may be gold-silver alloy, gold-indium alloy, gold-palladium alloy, gold-cobalt alloy, gold-nickel alloy, or gold-copper alloy.

(B-5) Removing Resist Film 7 in First Region X

Next, the resist film 7 in the first region X is removed using a resist-removing solution. When the first plated layer 5 is formed on the corresponding surface of the resist film 7, the resist film 7 and the first plated layer 5 formed on the surface of the resist film 7 can be simultaneously removed. Through the steps as described above, as shown in FIG. 2F, a lead frame 40 including a lead part 36, which includes the first region X without the first plated layer 5 and the second region Y with the first plated layer 5, is obtained. Hereinafter, the metal plate 30 with the first plated layer 5 is referred to as the lead frame 40, and the metal part 35 with the first plated layer 5 is referred to as the lead part 36.

(B-6) Disposing Second Plated Layer 6

Forming the lead frame 40 preferably includes, before (B-4) disposing the first plated layer 5, disposing the second plated layer 6 on surfaces of the metal part 35. The second plated layer 6 may be formed using electroplating or electroless plating. The second plated layer 6 may cover the first region X, or both the first region X and the second region Y With the second plated layer 6 on the surfaces of the metal part 35, oxidization of the surfaces of the metal plate 30 formed of copper alloy can be reduced. This also allows for reducing precipitation of a component of the metal plate 30 such as copper on the surfaces of the first plated layer 5, which is the outermost surfaces. This allows for reducing, for example, when connecting the electrodes of the light emitting element 10 and the first plated layer 5 with wires or the like (including wires or a bonding member), reduction in connection strength between the first plated layer 5 and the wires. The second plated layer 6 may be formed over the entirety of or part of the metal part 35. When the lead frame 40 includes the first plated layer 5 and the second plated layer 6, the first plated layer 5 becomes the outermost layer and the second plated layer 6 may be the intermediate layer or the base layer.

The second plated layer 6 includes a single or a plurality of metal layer(s) containing, for example, copper, copper alloy, nickel, nickel alloy, palladium, palladium alloy, rhodium, or rhodium alloy. The second plated layer 6 does not substantially contain gold or gold alloy. The expression "does not substantially contain gold or gold alloy" as used herein encompasses a case in which gold or gold alloy is unavoidably mixed in the second plated layer 6. The content of gold or gold alloy is, for example, 0.05 mass percent or less. When the second plated layer 6 has a layered structure, the second plated layer 6 include, for example, in sequence from the metal part 35 side, a metal layer containing nickel or nickel alloy, and a metal layer containing palladium, palladium alloy, rhodium, or rhodium alloy. The second plated layer 6 formed by plating may be disposed in place of a metal layer formed by sputtering, a conductive paste, or vapor deposition. The metal layer may be formed of the materials described above as examples of a material for the second plated layer 6.

(B-6) Disposing the second plated layer 6 may be performed, for example, between (A) providing the metal plate 30 and (B) providing the lead frame 40. Alternatively, (B-6) disposing the second plated layer 6 may be performed between (B-3) removing a portion of the resist film 7 at regions other than the first region X and (B-4) disposing the first plated layer 5. When the second plated layer 6 has a layered structure, all of the layers in the second plated layer 6 may be simultaneously formed between (A) providing the metal plate 30 and (B) providing the lead frame 40 or between (B-3) removing a portion of the resist film 7 other than the first region X and (B-4) disposing the first plated layer 5, or separately formed between (A) providing the metal plate 30 and (B) providing the lead frame 40 and between (B-3) removing a portion of the resist film 7 other than the first region X and (B-4) disposing the first plated layer 5. For example, when the second plated layers 6 include a metal layer containing nickel or the like and a metal layer containing palladium or the like, the metal layer containing nickel or the like and the metal layer containing palladium or the like may be formed between the (A) providing the metal plate 30 and the (B) providing the lead frame 40; the metal layer containing nickel or the like and the metal layer containing palladium or the like may be formed between the (B-3) removing a portion of the resist film 7 other than the first region X and the (B-4) disposing the first plated layer 5; or the metal layer containing nickel or the like may be formed between the (A) providing the metal plate 30 the (B) providing the lead frame 40, and the metal layer containing palladium or the like may be formed between the (B-3) removing a portion of the resist film 7 other than the first region X and the (B-4) disposing the first plated layer 5.

Figure 2G:
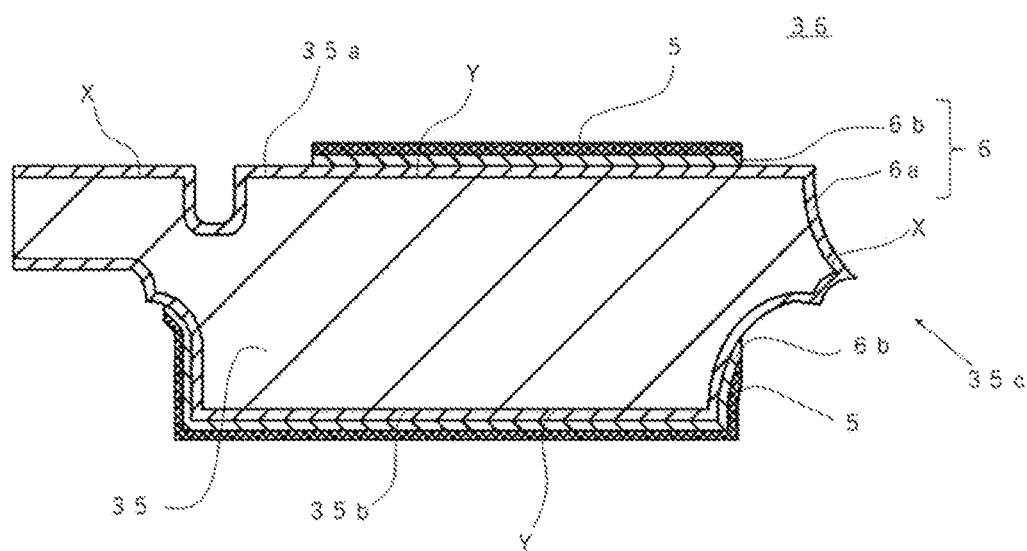
FIG. 2G is a schematic cross-sectional view showing one example of a lead part.

FIG. 2G shows an example of the lead part 36 including the first plated layer 5 and the second plated layer 6. The second plated layer 6 shown in FIG. 2G includes a lower metal layer 6a and an upper metal layer 6b. In the second plated layer 6, the lower metal layer 6a is formed, for example, between the (A) providing the metal plate 30 and the (B) providing the lead frame 40, and covers both of the first region X and the second region Y The upper metal layer 6b is formed, for example, between the (B-3) removing a portion of the resist film 7 other than the first region X and the (B-4) disposing the first plated layer 5, and covers the second region Y The lower metal layer 6a covering both of the first region X and the second region Y of the metal part 35 can prevent the surfaces of the metal part 35 from being exposed outside, so that oxidization of the surfaces of the metal part 35 can be reduced. The upper metal layer 6b covering the second region Y of the metal part 35 also allows for reducing possibility of precipitation of a component of the metal part 35, such as copper, on the surface of the first plated layer 5 which is the outermost surface.

The thickness of the first plated layer 5 at the upper surface 30a side and the thickness of the first plated layer 5 at the lower surface 30b side of the metal plate 30 may be the same; the thickness of the first plated layer 5 may be greater at the upper surface 30a side of the metal plate 30 than at the lower surface 30b side of the metal plate 30; or the thickness of the first plated layer 5 may be smaller at the upper surface 30a side of the metal plate 30 than at the lower surface 30b side of the metal plate 30. For example, in electroplating, shielding plates of different sizes is disposed between the anode and the cathode such that cathode current density distribution is different between the upper surface 30a side and the lower surface 30b side of the metal plate 30. Accordingly, the first plated layer 5 having thickness different between the upper surface 30a side and the lower surface 30b side can be formed easily and simultaneously. When the thickness of the first plated layer 5 is greater at the upper surface 30a side of the metal plate 30 than at the lower surface 30b side, flatness of the first plated layer 5 at the upper surface 30a side can be increased, so that light emitted from the light emitting element 10 can be efficiently reflected upward. When the thickness of the first plated layer 5 is smaller at the upper surface 30a side of the metal plate 30 than at the lower surface 30b side, bonding strength between the light emitting device 100 and the bonding member can be improved in mounting the light emitting device 100 on a mounting substrate via a bonding member.

The thickness of the second plated layer 6 at the upper surface 30a side and the thickness of the second plated layer 6 at the lower surface 30b side of the metal plate 30 may be the same; the thickness of the second plated layer 6 may be greater at the upper surface 30a side of the metal plate 30 than at the lower surface 30b side of the metal plate 30; or the thickness of the second plated layer 6 may be smaller at the upper surface 30a side of the metal plate 30 than at the lower surface 30b side of the metal plate 30. For example, in electroplating, by setting different current density between the upper surface 30a side and the lower surface 30b side of the metal plate 30, the second plated layer 6 having thickness different between the upper surface 30a side and the lower surface 30b side can be formed easily and simultaneously. When the thickness of the second plated layer 6 is greater at the upper surface 30a side of the metal plate 30 than at the lower surface 30b side, flatness of the first plated layer 5 and the second plated layer 6 at the upper surface 30a side can be increased, so that light emitted from the light emitting element 10 can be efficiently reflected upward. When the thickness of the second plated layer 6 is smaller at the upper surface 30a side of the metal plate 30 than at the lower surface 30b side, bonding strength between the light emitting device 100 and the bonding member can be improved in mounting the light emitting device 100 on a mounting substrate via a bonding member. When second plated layer 6 includes a plurality of layers, the "thickness of the second plated layer 6" as described above may refer to a thickness of each of the plurality of layers or the total thickness of the plurality of layers.

(C) Providing Resin Molded Body 8

Figure 3A:
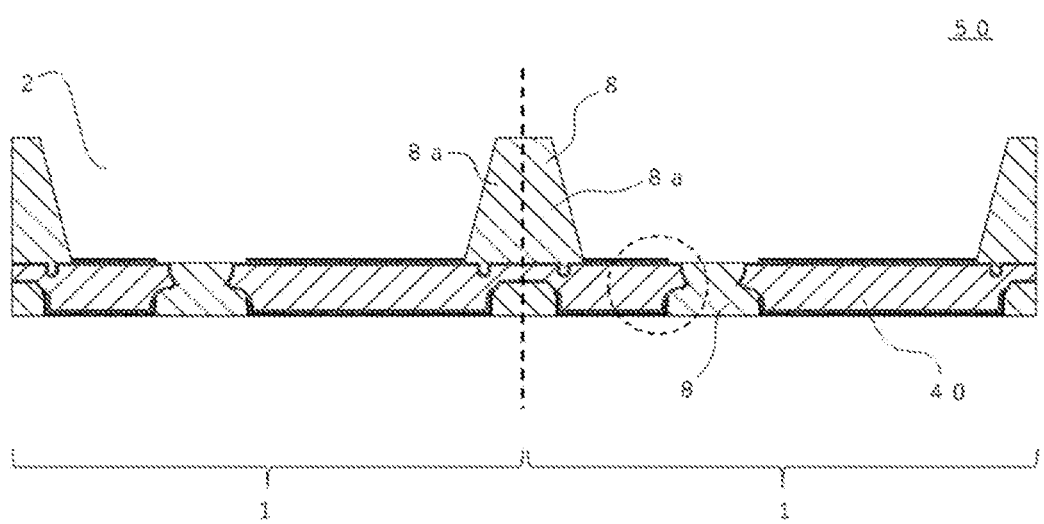
FIG. 3A is a schematic cross-sectional view of a first structure according to the first embodiment.
Figure 3B:
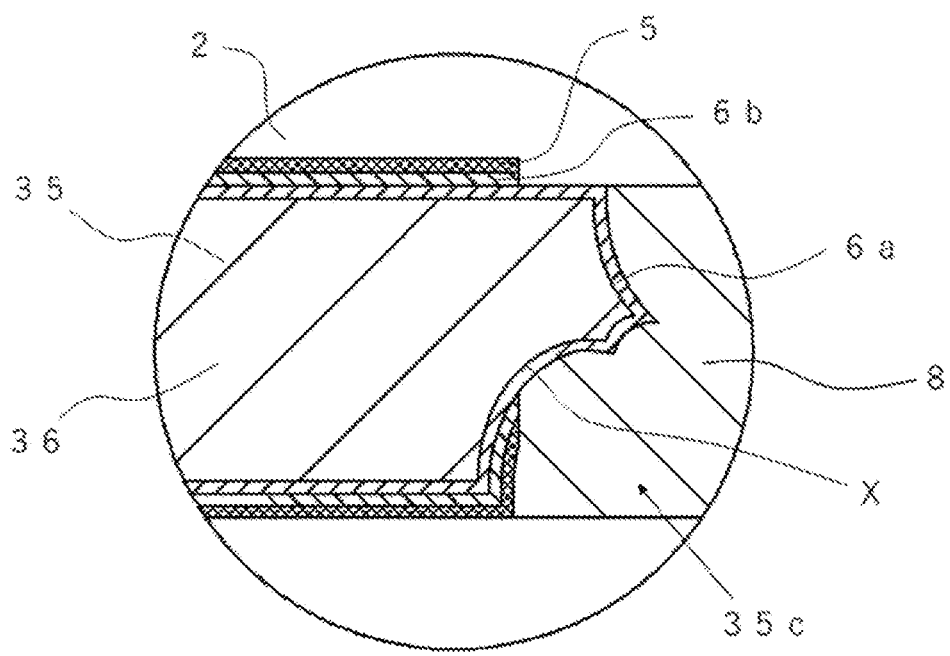
FIG. 3B is a partial enlarged view of the portion encircled by a broken line in FIG. 3A.

Next, a resin molded body 8 is integrally molded with the lead frame 40. Accordingly, a first structure 50 (a lead frame with a resin molded body) including the lead frame 40 and the resin molded body 8 and defining a plurality of recesses 2 at the upper surface side can be obtained. FIG. 3A is a schematic cross-sectional view of the first structure 50 with the lead frame 40 including the lead parts 36 which has been described with reference to FIG. 2G. FIG. 3B is a partial enlarged view of the portion encircled by a broken line in FIG. 3A. The first structure 50 includes a plurality of package regions 1, and each of the recesses 2 is defined in a respective one of the package regions 1. To obtain the first structure 50, for example, the lead frame 40 is disposed in a resin-molding mold such that, for example, pairs of lead parts 36 are supported at predetermined positions in the cavities of the resin-molding mold. Then, a resin material to be the resin molded body 8 is injected into the cavities of the resin-molding mold and solidified. Thus, the first structure 50, including the resin molded body 8 in which the resin parts 8a of the package regions 1 are integrally formed, can be provided. Forming the resin molded body 8 may be performed using, for example, transfer molding or injection molding.

At the bottom surface of each recess 2, the upper surface of each of a pair of lead parts 36 is located, and the first plated layer 5 above the upper surface of the metal part 35 is located. The first plated layer 5 is a metal layer less likely to be oxidized or sulfurized, and accordingly oxidation or sulfuration of the surface of the metal part 35 can be reduced when provided with the first plated layer 5. Furthermore, for example, in connecting one end of wires connected to electrodes of the light emitting element 10 to the first plated layer 5, such a first plated layer 5, which is less likely to be oxidized or sulfurized, allows for reducing reduction in connection strength between the first plated layer 5 and the wires. Still further, with the wires made of a material containing gold or gold alloy, connection strength between the first plated layer 5 and such wires can be further improved.

The resin molded body 8 covers the first region X of the lead part 36. In the lead part 36 shown in FIG. 3B, the lower metal layer 6a is positioned at the first region X, so that the resin molded body 8 is in contact with the lower metal layer 6a located in the first region X. The first plated layer 5 is not formed at the first region X, which allows for improving adhesion strength between the resin molded body 8 and a pair of lead parts 36 at the first region X. This allows for effectively reducing reduction in adhesion strength between the resin molded body 8 and the pair of lead parts 36. Accordingly, for example, the possibility of occurrence of leakage of a sealing member 9 disposed in the recess 2, which will be described below, from the upper surface side toward the lower surface side of the lead part 36 through the interface between the first end surface 35c of the lead part 36 and the resin molded body 8 can be reduced. Further, when mounting a discrete light emitting device 100 on a mounting substrate via the bonding member such as solder, possibility of entry of a bonding member such as solder into the recess 2 through the interface between the first end surface 35c of the lead part 36 of the resin molded body 8 can be reduced.

In the resin molded body 8, a portion of the lower surface of the lead frame 40 is exposed outside. With such a structure, in the discrete light emitting device 100, heat generated at the light emitting element 10 disposed at the upward-facing surface of the recess 2 is efficiently released from the lower surface side. On the other hand, with a structure in which the lower surface of the lead frame 40 is exposed outside, in the discrete light emitting device 100, the sealing member 9 disposed in the recess 2 may leak toward the lower surface side, or a bonding member such as solder may enter the recess 2. However, according to the method of manufacturing a light emitting device of the present disclosure, the first region X without the first plated layer 5 is provided, and the first region X is covered with the resin molded body 8, which allows for improving adhesion strength between the resin molded body 8 and the pair of lead parts 36. Accordingly, in the discrete light emitting device 100, possibility of occurring problems such as leakage of the sealing member 9 toward the lower surface side can be reduced. With reference to FIG. 3A, at the lower surface of the first structure 50, the lower surface of the lead frame 40 and the lower surface of the resin molded body 8 are substantially in the same plane as each other. In the height direction, the difference between a height of the lower surface of the lead frame 40 and a height of the lower surface of the resin molded body 8 is, for example, ±10 μm or less.

The expression "providing the first structure 50" encompasses both a case of manufacturing the first structure 50 to provide the first structure 50, and a case of purchasing the first structure 50 that has been manufactured to provide the first structure 50.

(D) Disposing Second Structure 60

Figure 4A:
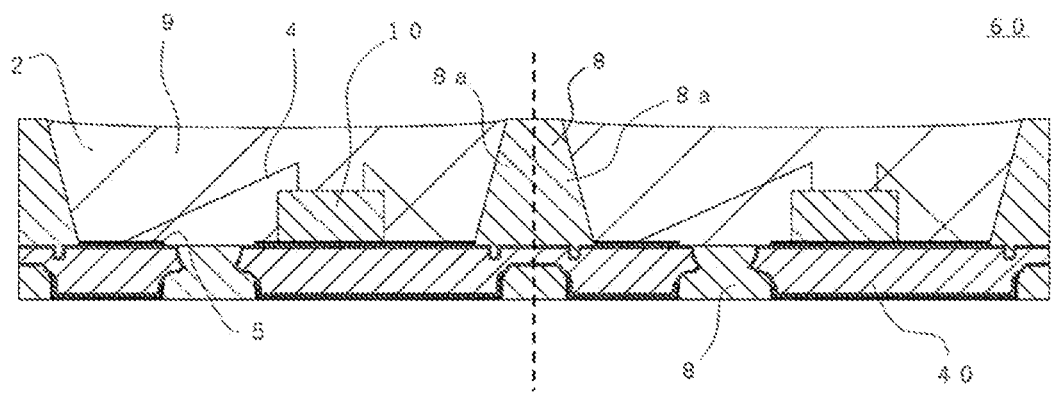
FIG. 4A is a schematic cross-sectional view of a second structure according to the first embodiment.

Next, the light emitting element 10 is disposed on the upward-facing surface of the recess 2 of the first structure 50. For example, as shown in FIG. 4A, the light emitting element 10 includes positive and negative electrodes (not shown) at a single surface side of the light emitting element 10, and is disposed on an upper surface of one of a pair of lead parts 36 exposed at the upward-facing surface of the recess 2. The positive and negative electrodes of the light emitting element 10 and the pair of lead parts 36 are connected to each other via the wires 4. The light emitting element 10 may include positive and negative electrodes at a single surface side, and be disposed on the upper surfaces of a pair of lead parts 36 via a conductive bonding member such that the positive and negative electrodes face the upper surface of the pair of lead parts 36, respectively.

Figure 4B:
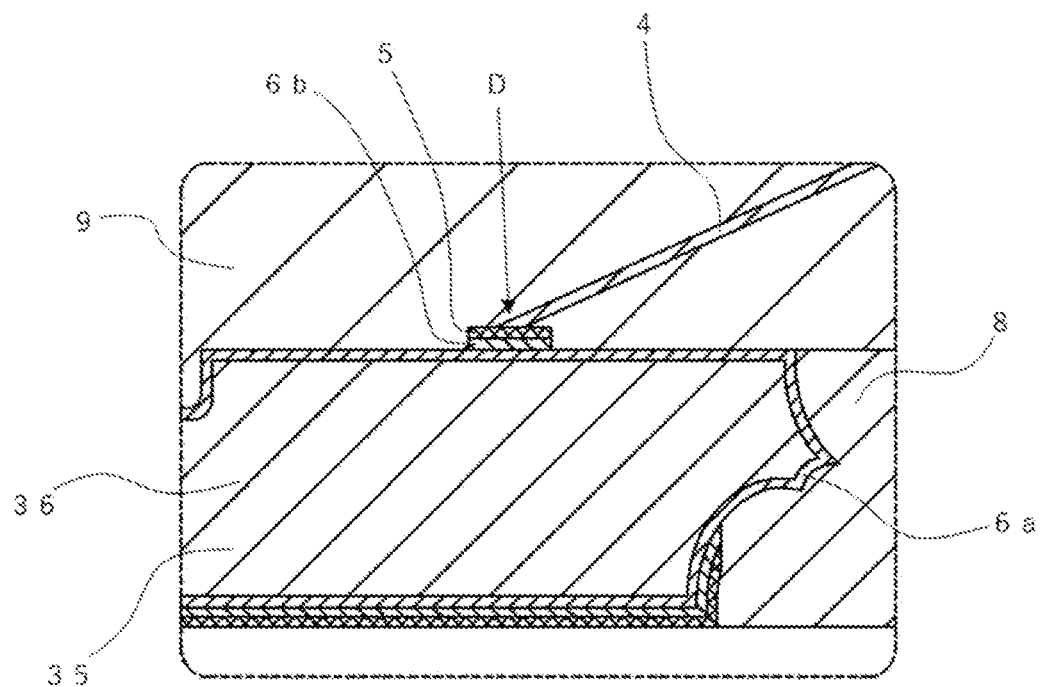
FIG. 4B is a schematic cross-sectional view showing one example of configuration of the first plated layer.

The first plated layer 5 preferably covers at least a disposing region D in the upper surface of the lead part 36 where the wire 4 or the bonding member is disposed. The first plated layer 5 is a metal layer less likely to be oxidized or sulfurized, and accordingly connection strength or bonding strength of the wires 4 or the bonding member can be improved. Alternatively, as shown in FIG. 4B, the first plated layer 5 may cover only the disposing region D in the upper surface of the lead part 36 where the wire 4 or the bonding member is disposed. This allows for reducing the volume of the used first plated layer 5, and accordingly reducing the costs for the light emitting device 100 while improving connection strength or bonding strength of the wire 4 or the bonding member. The disposing region D for the wire 4 has an area in a range of 80 times to 400 times, preferably 150 times to 200 times, as great as a cross-sectional area of the wire 4 (a cross-sectional area along the diameter of the wire). The disposing region D for the bonding member has an area in a range of, for example, 10 times to 50 times, preferably 20 times to 25 times, as great as the planar area of the bonding member.

Next, a sealing member 9 is disposed in the recess 2 so as to cover the light emitting element 10. The sealing member 9 may contain a fluorescent material and/or a light diffusing member. The sealing member 9 may be disposed such that, for example, a mixture material, in which a fluorescent material and/or a light diffusing member is contained in a resin material serving as a base material, is discharged into the recess 2 using a dispenser or the like. Thereafter, curing is performed, so that the sealing member 9 is obtained. Between disposing the mixture material in the recess 2 and curing, sedimentation may be performed. By sedimentation, the fluorescent material and the like can be predominantly distributed at the bottom surface side of the recess 2. This allows for effectively reducing variation in emission color of a discrete light emitting device 100.

(E) Obtaining a Plurality of Light Emitting Devices 100

Figure 5A:
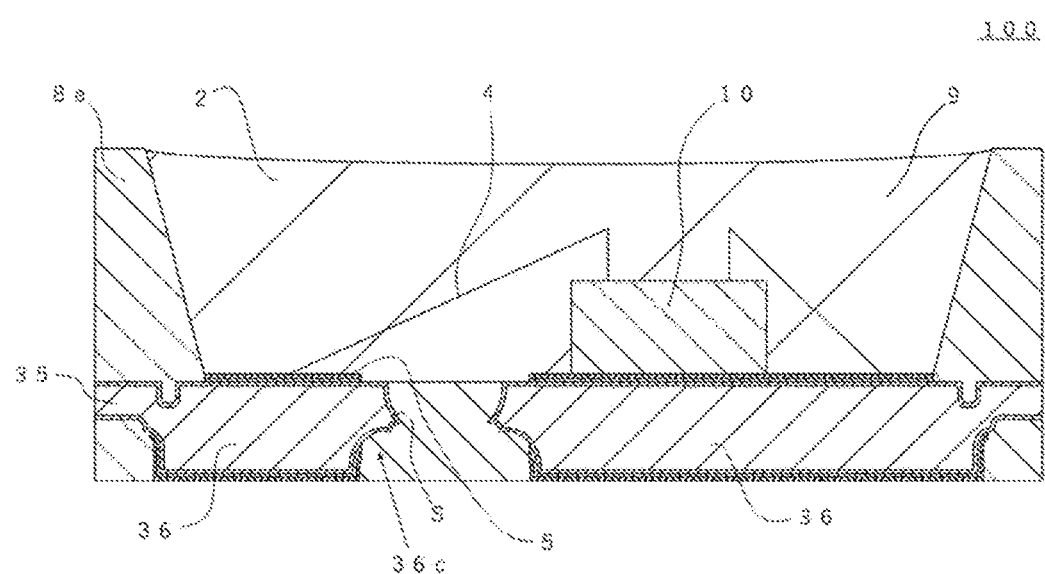
FIG. 5A is a schematic cross-sectional view of a light emitting device according to the first embodiment.
Figure 5B:
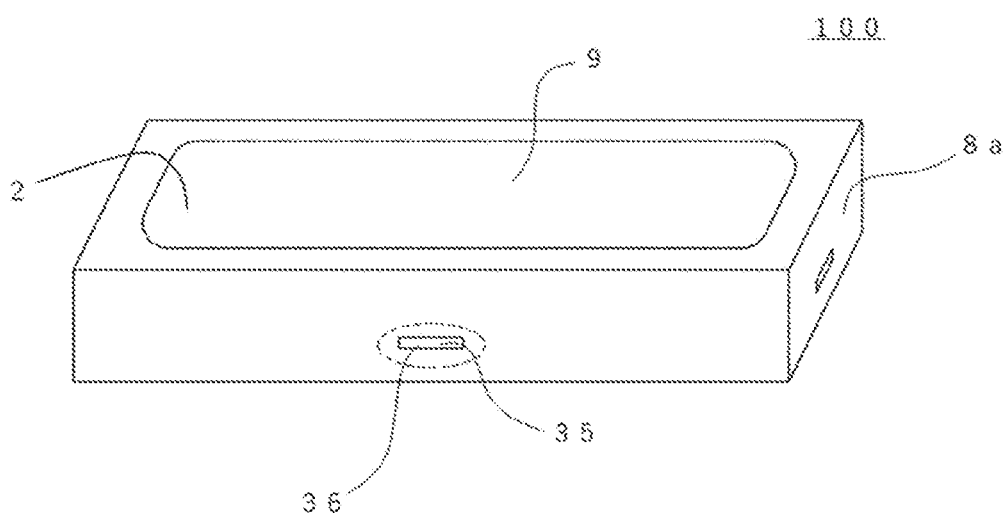
FIG. 5B is a schematic perspective view of the light emitting device according to the first embodiment.
Figure 5C:
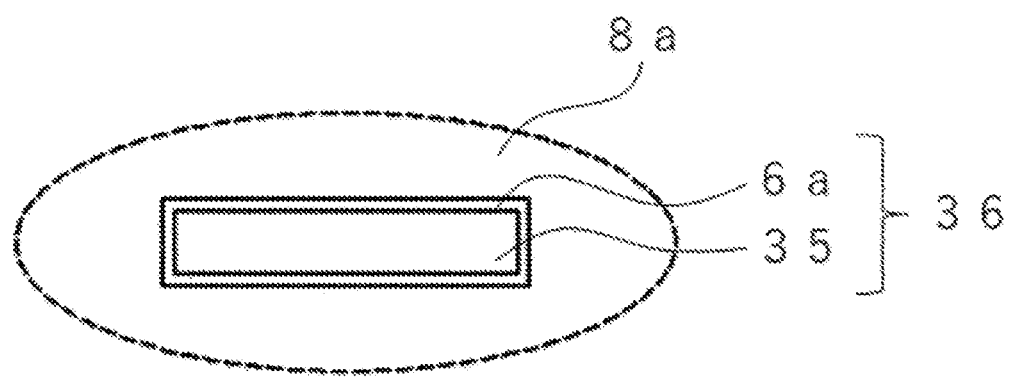
FIG. 5C is a partial enlarged view of the portion encircled by a broken line in FIG. 5B.
Figure 5D:
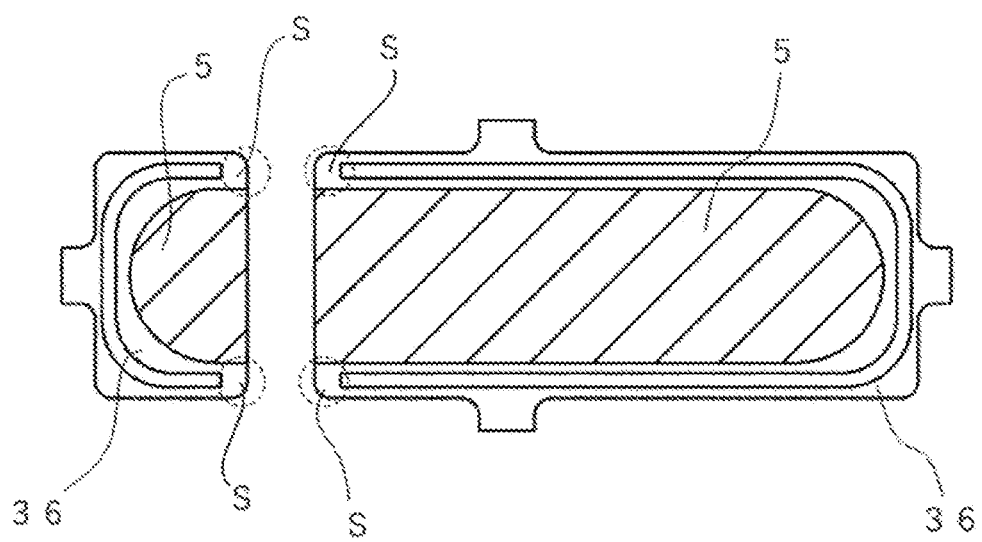
FIG. 5D is a schematic top view of a pair of leads.

The second structure 60 is separated into discrete light emitting devices 100. The separation can be performed using, for example, a lead cut die, a dicing saw, or laser light. Thus, the light emitting device 100 shown in FIGS. 5A, 5B, and 5C is obtained. FIG. 5A is a schematic cross-sectional view of the light emitting device 100 according to the first embodiment. FIG. 5B is a schematic perspective view of the light emitting device 100 according to the first embodiment. FIG. 5C is a partial enlarged view of the portion encircled by a broken line in FIG. 5B. FIG. 5D is a schematic top view of only a pair of lead parts 36, in which the region provided with the first plated layer 5 is hatched.

As shown in FIG. 5A, each lead part 36 and the resin part 8a are preferably in the same plane at a corresponding outer lateral surface of the light emitting device 100. With the lead parts 36 not extending outward of the resin part 8a at the outer lateral surfaces of the light emitting device 100, a small light emitting device 100 occupying a smaller area can be obtained. The lead parts 36 may extend outward of the resin part 8a at the outer lateral surfaces of the light emitting device 100. This allows for efficiently releasing heat generated in the light emitting element 10 toward the outside.

As shown in FIGS. 5A and 5C, at the outer lateral surfaces of the light emitting device 100, the first plated layer 5 is preferably not positioned between the lead parts 36 and the resin part 8a. This allows for improving adhesion between the resin part 8a and the lead parts 36 at the outer lateral surface of the light emitting device 100, and allows for effectively preventing entry of moisture or the like via the interface between the resin part 8a and the lead parts 36 at the outer lateral surfaces. In FIG. 5C, at an outer lateral surface of the light emitting device 100, the metal part 35 and the lower metal layer 6a (a metal layer containing, for example, nickel or nickel alloy) covering the metal part 35 are exposed from the resin part 8a.

As shown in FIG. 5A, in the light emitting device 100, the first end surface 36c of each lead part 36, facing the other of the pair of lead parts 36, includes a region where the first plated layer 5 is not formed. This structure allows for reducing possibility of occurrence of leakage of the sealing member 9, disposed in the recess 2 at the lower surface side of the lead part 36, through the interface between the first end surface 36c of the lead part 36 and the resin part 8a. In the light emitting device 100 shown in FIG. 5A, the first plated layer 5 is not disposed at the upper surface side of the first end surface 36c. Thus, with a structure in which the first plated layer 5 is not disposed at a portion in contact with the sealing member 9 in the interface between the first end surface 36c of the lead part 36 and the resin part 8a, the possibility of occurrence of leakage of the sealing member 9 to the outside from the recess 2 can be reduced. The first plated layer 5 may be absent in the entirety of the first end surface 36c, or on a portion of the first end surface 36c.

As shown in FIG. 5A, in the light emitting device 100, the first plated layer 5 is preferably not formed at a connecting region S including the first end surface 36c of the lead part 36 and the upper surface connected to the first end surface 36c. Thus, the upper surface side region of the connecting region S is adhered to the sealing member 9 with a high adhesion, and the end surface side region of the connecting region S is adhered to the resin part 8a with a high adhesion. This allows for effectively reducing possibility of occurrence of leakage of the sealing member 9 to the outside from the recess 2. The connecting region S, in which the first plated layer 5 is not disposed, may be located over the entirety of the end surface 36c side region of each lead part 36 in a direction perpendicular to a direction from one lead part 36 to another lead part 36. Alternatively, as shown in FIG. 5D, the connecting region S, in which the first plated layer 5 is not disposed, may be located on a portion of the end surface 36c side region of each lead part 36 in the direction perpendicular to the direction from one lead part 36 to another lead part 36.

Members used in the method of manufacturing the light emitting device 100 according to certain embodiments of the present disclosure will be described below.

Metal Plate 30 and a Pair of Metal Parts 35

Examples of a material of the metal plate 30 and a material of the pair of metal parts 35 include copper, aluminum, silver, iron, nickel, and alloy of one or more of these metals. The metal plate 30 and the pair of metal parts 35 do not substantially contain gold or gold alloy. The expression "does not substantially contain gold or gold alloy" as used herein encompasses a case in which gold or gold alloy is unavoidably mixed in the metal plate 30 and/or the pair of metal parts 35. The content of gold or gold alloy is, for example, 0.05 mass percent or less. The metal plate 30 and the pair of metal parts 35 may be a single layer or may have a layered structure (for example, a clad member). In particular, for a material of the metal plate 30 and a material of the pair of metal parts 35, copper or copper alloy, which is inexpensive and has a high heat dissipation property, can be preferably employed. A thickness or a shape of the metal plate 30 may be selected as appropriate according to a thickness, a shape, or the like of the light emitting device 100. The metal plate 30 may have a flat plate shape, may partially include a bent portion, or may have a thickness that is partially increased or partially reduced.

The metal plate 30 includes a plurality of pairs of metal parts 35. In each package region 1, the metal plate 30 may include an additional metal part in addition to a pair of metal parts 35. The additional metal part may function as a heat dissipation member, or as an electrode similarly to the pair of metal parts 35.

Resin Molded Body 8, Resin Part 8a

For a resin material serving as a base material of the resin molded body 8 and the resin part 8a, a thermosetting resin or a thermoplastic resin may be used. More specifically, examples of the resin material include an epoxy resin composite, a silicone resin composite, or a modified epoxy resin composite such as silicone modified epoxy resin, a modified silicone resin composite such as epoxy modified silicone resin, a modified silicone resin composite, unsaturated polyester resin, saturated polyester resin, a polyimide resin composite, a modified polyimide resin composite, polyphthalamide (PPA), polycarbonate resin, polyphenylene sulfide (PPS), liquid crystal polymer (LCP), ABS resin, phenolic resin, acrylic resin, and PBT resin. In particular, for the resin material used for the resin molded body 8 and the resin part 8a, an epoxy resin composite or a silicone resin composite, which withstands heat and light, is preferably used.

The resin molded body 8 and the resin part 8a preferably contain a light reflective substance in the resin material, serving as a base material, of the resin molded body 8 and the resin part 8a. For the light reflective substance, a material that does not easily absorb light emitted from the light emitting element 10 and that has a refractive index greatly different from a refractive index of the resin material used as the base material. Examples of such a light reflective substance include titanium oxide, zinc oxide, silicon oxide, zirconium oxide, oxidation aluminum, and aluminum nitride.

In order to improve contrast of the light emitting device 100, the resin molded body 8 and the resin part 8a may contain filler having a low light reflectivity to extraneous light on the light emitting device 100 (typically, sunlight). In this case, the resin molded body 8 and the resin part 8a are black or similar color. For the filler, carbon such as acetylene black, activated carbon, or graphite, transition metal oxides such as iron oxide, manganese dioxide, cobalt oxide, or molybdenum oxide, colored organic pigment, or the like can be used according to the purpose.

Light Emitting Element 10

The light emitting element 10 functions as the light source of the light emitting device 100, and further functions as the excitation source for the fluorescent material. For the light emitting element 10, a light emitting diode element or the like can be used, and a nitride semiconductor ($In_xAl_yGa_{1-x-y}N$, $0 \leq x$, $0 \leq y$, $x+y \leq 1$) configured to emit light in visible region can be preferably used. While the light emitting device 100 shown in FIG. 5A includes one light emitting element 10, any another appropriate number of light emitting elements 10 may be used in the light emitting device 100 according to the present embodiment. The light emitting device 100 includes at least one light emitting element. Various number of light emitting elements 10 may be used according to the purpose or intended use.

When the light emitting device 100 includes a plurality of light emitting elements 10, the plurality of light emitting elements 10 may include, for example, a plurality of blue-light emitting elements configured to emit blue light, three light emitting elements respectively configured to emit blue light, green light, and red light, or a combination of a light emitting element configured to emit blue light and a light emitting element configured to emit green light. When using the light emitting device 100 for a light source of a liquid crystal display device or the like, for the at least one light emitting element, a light emitting element configured to emit blue light, or a combination of a light emitting element configured to emit blue light and a light emitting element configured to emit green light is preferably used. For each of the light emitting element configured to emit blue light and the light emitting element configured to emit green light, a light emitting element having a half band width of 40 nm or less, preferably 30 nm or less, is preferably used. Thus, the blue-color light or the green-color light can easily have a sharp emission peak. Accordingly, for example, when the light emitting device 100 is used for the light source for a liquid crystal display device or the like, the liquid crystal display device can have a high color reproducibility. The plurality of light emitting elements 10 are connected in series, in parallel, or in a combination of series and parallel.

Sealing Member 9

The light emitting device 100 includes the sealing member 9 that covers the light emitting element 10. The sealing member 9 protects the light emitting element and other components from external forces, dust, moisture and the like. The sealing member 9 preferably transmits 60% or more, further preferably 90% or more, of light emitted from the light emitting element 10. For the base material of the sealing member 9, a resin material used in the resin molded body 8 can be used. The sealing member 9 may be provided as a single layer or may include a plurality of layers. In the sealing member 9, a light diffusing member such as titanium oxide, silicon oxide, zirconium oxide, or oxidation aluminum may be dispersed.

The sealing member 9 may contain a single or a plurality of types of fluorescent material adapted to convert wavelength of light emitted from the light emitting element 10. A fluorescent material adapted to be excited by light from the light emitting element 10 is used for the fluorescent material, and example of such a fluorescent material include, $(Ca, Sr, Ba)_5(PO_4)_3(Cl, Br):Eu$, $(Sr, Ca, Ba)_4Al_{14}O_{25}:Eu$, $(Ca, Sr, Ba)_8MgSi_4O_{16}(F, Cl, Br)_2:Eu$, $(Y, Lu, Gd)_3(Al, Ga)_5O_{12}:Ce$, $(Sr, Ca)AlSiN_3:Eu$, $3.5MgO \cdot 0.5MgF_2 \cdot GeO_2:Mn$, $(x\text{-}s)MgO \cdot (s/2)Sc_2O_3 \cdot yMgF_2 \cdot uCaF_2 \cdot (1-t)GeO_2 \cdot (t/2)M^t{}_2O_3:zMn$ ($2.0 \leq x \leq 4.0$, $0 < y < 1.5$, $0 < z < 0.05$, $0 \leq s < 0.5$, $0 < t < 0.5$), $Ca_3Sc_2Si_3O_{12}:Ce$, $CaSc_2O_4:Ce$, $(La, Y)_3Si_6N_{11}:Ce$, $(Ca, Sr, Ba)_3Si_6O_9N_4:Eu$, $(Ca, Sr, Ba)_3Si_6O_{12}N_2:Eu$, $(Ba, Sr, Ca)Si_2O_2N_2:Eu$, $(Ca, Sr, Ba)_2SiSNs:Eu$, $(Ca, Sr, Ba)S:Eu$, $(Ba, Sr, Ca)Ga_2S_4:Eu$, $K_2(Si, Ti, Ge)F_6:Mn$, $Si_{6-z}Al_zO_zN_{8-z}:Eu$ ($0 < z < 4.2$).

The content of the light diffusing member and/or the fluorescent material preferably is in a range of, for example, about 10 weight percent to 150 weight percent to the total weight of the sealing member 9.

Wires 4 and Bonding Member

The wires 4 and the bonding member are members each connecting a corresponding one of the electrodes of the light emitting element 10 and a corresponding one the lead parts 36. Examples of a material of the wires 4 include a metal such as gold, copper, silver, platinum, aluminum, or palladium, or alloy containing at least one of these metals. For a conductive bonding member, conductive paste of silver, gold, or palladium, or a eutectic solder material such as gold-tin, tin-silver-copper, a brazing material such as low melting point metals, bumps containing silver or gold, or the like can be used. For an insulating bonding member, an epoxy resin composite, a silicone resin composite, or a polyimide resin composite, a modified resin or hybrid resins can be used. When using such a resin, in consideration of deterioration attributed to light and heat from the light emitting element 10, a metal layer of an aluminum film or a silver film having high reflectance, or a dielectric reflective film can be disposed on a mounting surface of the light emitting element 10.

The wires 4 and the bonding member are preferably formed of a material containing gold or gold alloy. This allows for improving connection strength between the wires 4 and the first plated layer 5 in connecting the wires 4 and others to the first plated layer 5. This also allows for reducing possibility that the wires 4 becoming soft and broken by, for example, stress applied from the sealing member 9.

Variant Examples

In (B) providing the lead frame 40, instead of the operations (B-1) disposing the resist film 7 using electrodeposition, (B-2) drying the resist film 7, and (B-3) removing a portion of the resist film 7 other than the first region X, forming a mask at the second region Y, which is the region other than first region X in the metal plate 30, forming the resist film 7 using electrodeposition on the metal plate 30 provided with the mask, drying the resist film 7, and removing the mask may be performed to obtain the metal plate 30 provided with the resist film 7 only in the first region X. For the mask, a conductive or insulating member may be used, and an insulating mask is preferably used. When using an insulating mask, the resist film 7 is not formed at the region where the mask is formed, which can facilitate removal of the mask. Example of the mask include a metal mask, a rubber mask and the like.

Figure 6A:
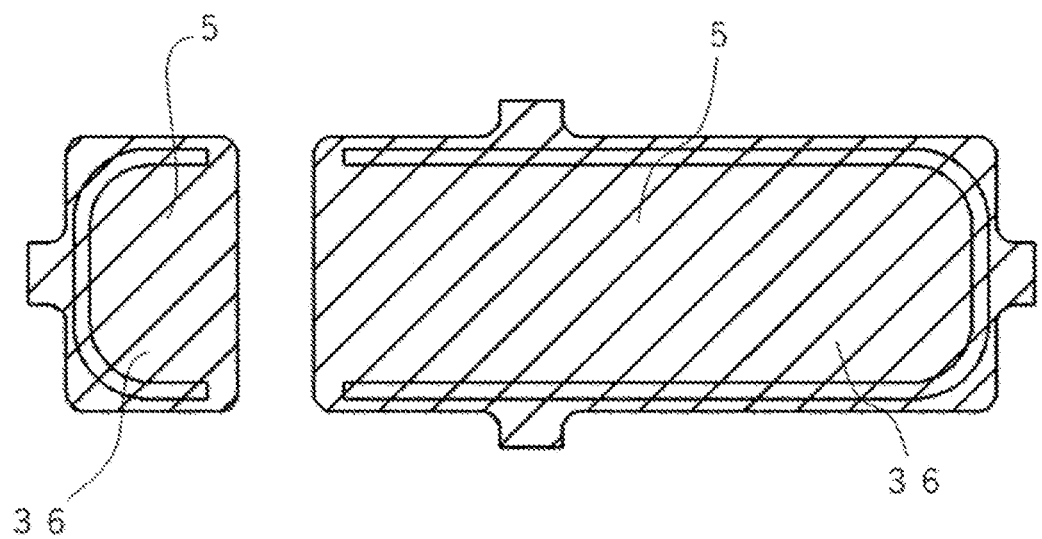
FIG. 6A is a schematic top view showing one example of configuration of the first plated layer.
Figure 6B:
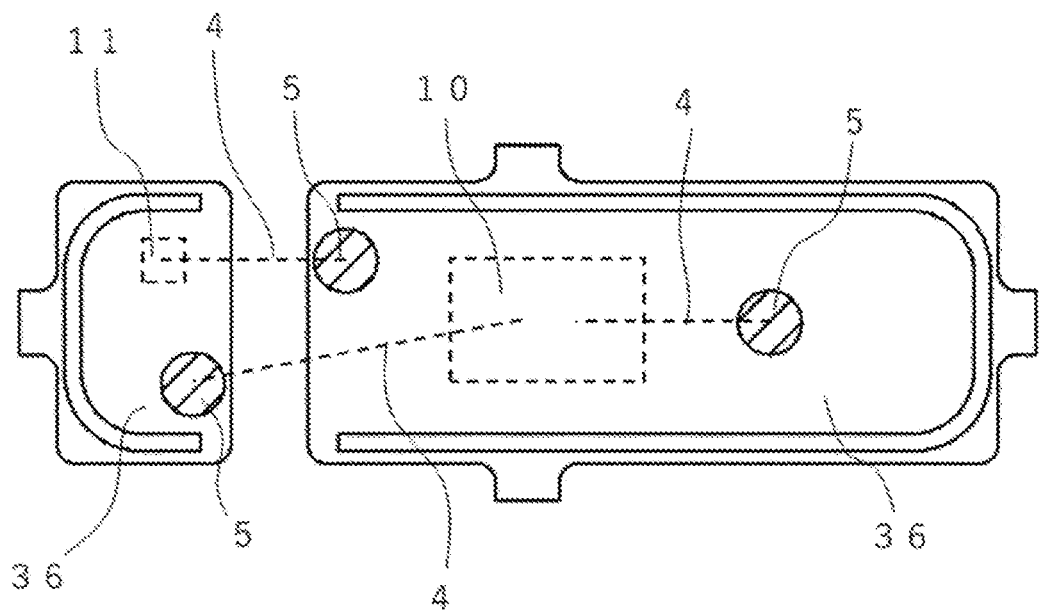
FIG. 6B is a schematic top view showing one example of configuration of the first plated layer.
Figure 6C:
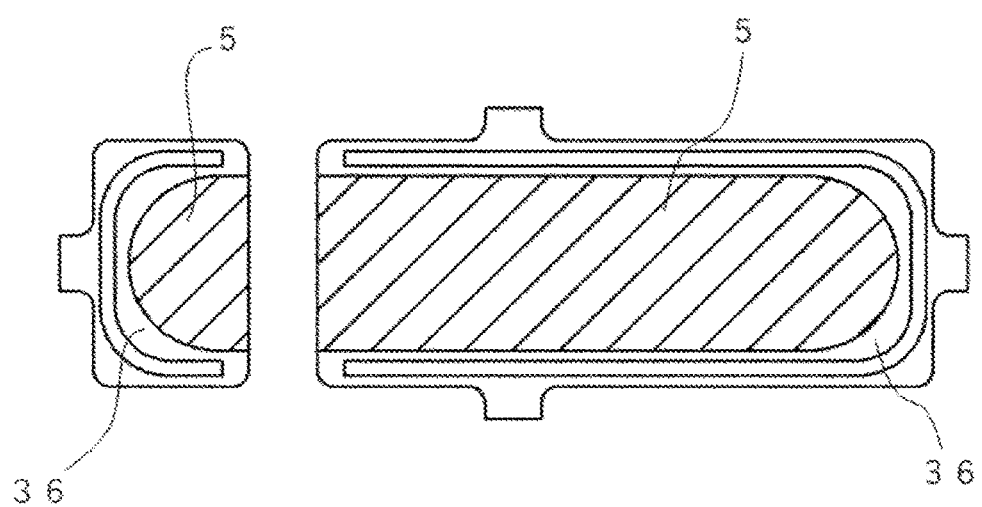
FIG. 6C is a schematic top view showing one example of configuration of the first plated layer.
Figure 6D:
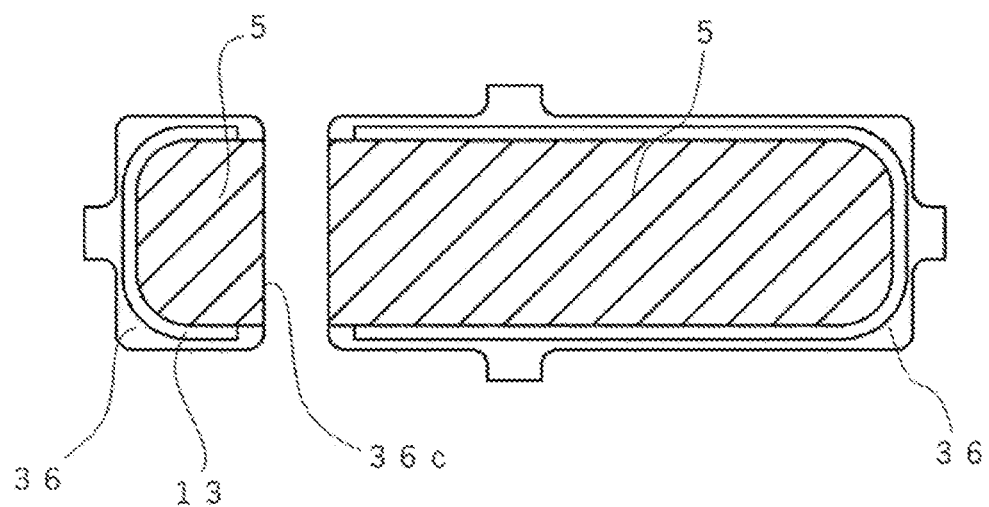
FIG. 6D is a schematic top view showing one example of configuration of the first plated layer.

The first plated layer 5 formed on the upper surface of a pair of lead parts 36 may have various configurations. Each of FIGS. 6A to 6D is a schematic top view of the pair of lead parts 36, in which a region provided with the first plated layer 5 is hatched. In FIG. 6B, the region where the light emitting element 10, the protective element 11, and the wires 4 are disposed is indicated by broken lines. In FIG. 6A, the first plated layer 5 is disposed over the entirety of the upper surfaces of the pair of lead parts 36. This allows for reducing possibility of occurrence of sulfuration or oxidation at the entirety of upper surface of the pair of lead parts 36. In FIG. 6B, the first plated layer 5 is disposed, in the upper surface of the lead part 36, only in regions to each of which one end of a respective wire 4 extending from the light emitting element 10 or the protective element 11 is connected and their respective vicinity regions. This structure allows for improving connection strength of the wires 4 while reducing the volume of the first plated layer 5 used for connection. In FIG. 6C, the first plated layer 5 is formed, in the upper surface of the lead part 36, only in the region exposed at the upward-facing surface of the recess 2. With this structure, for example, when a sulfur component or the like enters the recess 2 through the opening of the recess 2, sulfuration of the upper surface of the pair of lead parts 36 at the upward-facing surface of the recess 2 can be effectively reduced. In a variant example of FIG. 6C, the first plated layer 5 may be formed in the region defined by the groove 13 and the first end surface 36c located at the upper surface of the lead part 36, as shown in FIG. 6D.

EXAMPLES

Lead frames 40 used in Examples 1 to 7 were provided. A method of forming the lead frame 40 according to Example 1 will be described below as a specific example of a method of forming the lead frame 40.

The metal plate 30 was obtained by etching TAMAC194, which is available from Mitsubishi Shindoh Co., Ltd.

First, the lower metal layer 6a was formed over the entirety of surfaces of the metal plate 30 (the metal part 35). A nickel plated layer was used for the lower metal layer 6a.

The nickel plated layer was formed using an electroplating technique with a nickel sulfamate electroplating bath containing:

nickel sulfamate: 450 g/L
nickel chloride: 10 g/L and
boric acid: 30 g/L

The electroplating was performed at a temperature of 55° C. and a cathode current density of 5 A/dm$^2$ with adjustment of a plating time. For the anode, a sulfur-containing nickel electrode was used.

Next, the upper metal layer 6b was formed on the lower metal layer 6a so as to cover the entirety of surfaces of the metal plate 30. For the upper metal layer 6b, a palladium plated layer was used.

The palladium plated layer was formed using an electroplating technique with a palladium electroplating bath containing:

tetraammine palladium chloride: 5 g/L as palladium
ammonium nitrate: 150 g/L
2-pyridinesulfonic acid: 3 g/L, where
pH: 8.5 (adjusted by ammonia water)

The electroplating was performed at a temperature of 50° C. and a cathode current density of 0.5 A/dm$^2$ with adjustment of the plating time. A platinum-coated titanium electrode was used for the anode.

Next, the resist film 7 was formed at the surface of the metal plate 30 using negative resist liquid for electrophoretic deposition, at a temperature of 38° C., a voltage of 200 V, and for an immersion time of 15 seconds. After the resist film 7 was formed, drying was performed using a constant temperature drying oven at a temperature of 75 degrees and for a drying duration of 60 seconds. The thickness of the resist film 7 after the drying was in a range of 7 μm to 10 μm. When breakage or the like occurs at a corner portion of the resist film 7 in forming the first plated layer 5, deposition conditions and drying conditions can be adjusted so as to increase the thickness of the resist film 7 at corner portions. Before forming the resist film 7, surfaces of the metal plate 30 where the resist film 7 will be formed may be subjected to a cleaning process, such as degreasing.

Next, using a photomask, the resist film 7 was exposed to light having a main wavelength of 365 nm by a cumulative dose of 300 mJ/cm$^2$, to be cured. In the lead frame 40 of Example 1, a predetermined region of the resist film 7 was exposed so that the first plated layer 5 was disposed in the region shown in FIG. 6B (the hatched region). Thereafter, the not exposed resist film 7 was removed in a spray development technique using a developer solution at a temperature of 50° C. for 70 seconds. The manner of exposing may be selected as appropriate according to the shape of the metal plate 30. For example, if the end surface of the metal plate 30 has a shape with which the end surface is insufficiently exposed and accordingly the resist film 7 is failed to be hardened, using a light-diffusing light source or additionally performing local exposure in an oblique direction allows for securely irradiating light to the end surface of the metal plate 30, so that the resist film 7 is cured.

Next, on the surfaces of the upper metal layer 6b, the first plated layer 5 was formed in the region from which the resist film 7 had been removed (the second region Y). Thus, the first plated layer 5 partially covered the surface of the metal plate 30. A gold plated layer was used for the first plated layer 5.

The gold plated layer was formed using an electroplating technique with a gold electroplating bath containing:
potassium gold cyanide: 1 g/L as gold
potassium citrate: 100 g/L
dipotassium phosphate: 30 g/L, where
pH: 4.0 (adjusted by citric acid or potassium hydroxide)

The electroplating was performed at a temperature of 45° C. and a cathode current density of 2 A/dm² with adjustment of the plating time. A platinum-coated titanium electrode was used for the anode.

Next, the resist film 7 was removed using a resist-removing solution. Specifically, under the condition of a temperature of 60° C., a time of 60 seconds, and a spraying pressure of 0.2 MPa, the resist-removing solution was sprayed onto the resist film 7, to remove the resist film 7. In removing of the resist film 7, the removing condition may be adjusted according to the shape of the metal plate 30. For example, when surfaces of the metal plate 30 has many irregularities and the resist film 7 tends to be caught by the corner portions of the metal plate 30, the removing condition with an increased spraying pressure may be employed.

Next, as shown in FIG. 7, the lead frames 40 of Examples 2 to 7 were formed with types of plated layers and pattern shapes of the mask corresponding to the shape of the resist film 7 different from those of the lead frame 40 in Example 1. Also in each of the lead frames 40 of the Examples 2 to 7, the lower metal layer 6a and the upper metal layer 6b were formed to cover the entirety of surfaces of the metal plate 30, and the first plated layer 5 was formed to partially cover the surface of the metal plate 30.

In the lead frame 40 of Example 2, the lower metal layer 6a was a nickel plated layer, and the upper metal layer 6b was a palladium plated layer. The first plated layer 5 was a gold-silver alloy plated layer. The first plated layer 5 was formed at the region shown in FIG. 6B. The lead frame 40 of Example 2 was different from the lead frame 40 of Example 1 in that the first plated layer 5 was gold-silver alloy plated layer.

The gold-silver alloy plated layer of Example 2 was formed adding potassium silver cyanide by 0.1 g/L to the composition of the gold electroplating bath of Example 1.

In the lead frame 40 of Example 3, the lower metal layer 6a was a nickel plated layer, the upper metal layer 6b was a palladium nickel alloy plated layer, and the first plated layer 5 was a gold plated layer. The first plated layer 5 was formed at the region shown in FIG. 6C. The lead frame 40 of Example 3 was different from the lead frame 40 of Example 1 in that the upper metal layer 6b was a palladium nickel alloy plated layer.

The palladium nickel alloy plated layer of Example 3 was formed adding nickel sulfate by 0.5 g/L to the palladium plating bath composition of Example 1.

In the lead frame 40 of Example 4, the lower metal layer 6a was a nickel plated layer, the upper metal layer 6b was a rhodium plated layer, and the first plated layer 5 was a gold plated layer. The first plated layer 5 was formed in the region shown in FIG. 6C. The lead frame 40 of Example 4 was different from the lead frame 40 of Example 1 in that the upper metal layer 6b was a rhodium plated layer.

The rhodium plated layer of Example 4 was formed using an electroplating method with a rhodium electroplating bath containing:
rhodium sulfate: 3 g/L as rhodium
sulfuric acid: 25 g/L
lead acetate: 10 mg/L as lead The electroplating was performed, at a temperature of 50° C. and a cathode current density of 1 A/dm² with adjustment of the plating time. A platinum-coated titanium electrode was used for the anode.

In the lead frame 40 of Example 5, the lower metal layer 6a was a nickel plated layer, the upper metal layer 6b was a rhodium platinum alloy plated layer, and the first plated layer 5 was a gold plated layer. The first plated layer 5 was formed at the region shown in FIG. 6C. The lead frame 40 of Example 5 was different from the lead frame 40 of Example 1 in that the upper metal layer 6b was a rhodium platinum alloy plated layer.

The rhodium platinum alloy plated layer of Example 5 was formed adding chloroplatinic acid by 0.5 g/L to the rhodium plating bath composition of Example 4.

In the lead frame 40 of Example 6, the lower metal layer 6a was a nickel cobalt alloy plated layer, the upper metal layer 6b was a palladium plated layer, and the first plated layer 5 was a gold plated layer. The first plated layer 5 was formed in the region shown in FIG. 6D. The lead frame 40 of Example 6 was different from the lead frame 40 of Example 1 in that the lower metal layer 6a was a nickel cobalt alloy plated layer.

The nickel cobalt alloy plated layer of Example 6 was formed such that cobalt sulfamate by 45 g/L was added to the nickel plating bath composition of Example 1.

In the lead frame 40 of Example 7, the lower metal layer 6a was a nickel plated layer, the upper metal layer 6b was a palladium plated layer, and the first plated layer 5 was a gold plated layer. The first plated layer 5 was formed in the region shown in FIG. 6D. The lead frame 40 of Example 7 was different from the lead frame 40 of Example 1 in the region where the first plated layer 5 was formed.

In the foregoing manner, the lead frames 40 of Examples 1 to 7 were provided.

Next, a lead frame of Comparative example 1 was provided as follows. The type of plated layers was similar to that of the lead frames 40 of Examples 1 and 7. The first plated layer 5 was formed to cover the entirety of surfaces of the metal plate 30. Specifically, the lower metal layer 6a, the upper metal layer 6b, and the first plated layer 5 were formed over the entirety of surfaces of the metal plate 30. The lower metal layer 6a was a nickel plated layer, the upper metal layer 6b was a palladium plated layer, and the first plated layer 5 was a gold plated layer.

A lead frame of Comparative example 2 was provided as follows. The plating type of plated layers was similar to that of the lead frame 40 of Examples 1 and 7. The first plated layer 5 was formed using dry film resist in place of electrodeposition. Specifically, over the entire surface of the metal plate 30, the lower metal layer 6a and the upper metal layer 6b were formed. Then, the resist film 7 was formed using dry film resist, to form the first plated layer 5 partially on the upper metal layer 6b. The lower metal layer 6a was a nickel plated layer, the upper metal layer 6b was a palladium plated layer, and the first plated layer 5 was a gold plated layer.

Next, a resin was molded with a respective one of the lead frames 40 of Examples 1 to 7 and Comparative Examples 1 and 2 such that collective bodies each including the resin molded body 8 and corresponding lead frame 40 (i.e., a lead frame with a resin) were provided. In each of the collective bodies (lead frame molded with resin), a plurality of recesses 2 are defined in an upper surface side, and the first plated layer 5 is exposed at an upward-facing surface of each of the recesses 2.

Next, on the first plated layer 5 at the upward-facing surface of the recess 2, the light emitting element 10 was disposed. In the recess 2, the sealing member 9 containing a fluorescent material was formed. Subsequently, separation into a plurality of discrete light emitting devices was performed, to provide light emitting devices of each of the Examples 1 to 7 and Comparative examples 1 and 2.

Evaluation, Measurement

Next, the light emitting devices according to Examples 1 to 7 and Comparative examples 1 and 2 were each placed on a printed circuit board onto which lead-free solder (Sn-0.3Ag-0.7Cu) was applied, and reflowing was performed at a temperature of 260° C. for 10 seconds. Then, the light emitting devices were separated from the printed circuit board, and occurrence of entry of a solder into the recess 2 was evaluated. Occurrence of leakage of the sealing member 9 at the lower surface of each light emitting device was also evaluated. The evaluation results are shown in FIG. 7.

As shown in FIG. 7, entry of solder in recess 2 or leakage of the sealing member 9 at the lower surface of the light emitting device 100 did not occur in the light emitting devices 100 of Examples 1 to 7 did not show. On the other hand, entry of solder in the recess 2 and leakage of the sealing member at the lower surface of the light emitting device occurred in the light emitting devices of Comparative examples 1 and 2. In particular, Examples 1 and 7 and Comparative example 1 with the same the type of the plated layers were compared to one another. In Comparative example 1 in which the first plated layer 5 was positioned over the entire end surface of the metal part 35, entry of solder and leakage of the sealing member 9 were observed. On the other hand, in Examples 1 and 7 in which the first plated layer 5 was absent at the first region including the end surface of the metal part 35, entry of solder and leakage of the sealing member 9 were not observed. Furthermore, the Examples 1 to 7 in which the resist film 7 was formed using electrodeposition, the resist film 7 was formed with a desired thickness at the corner portions and the end surface of the metal part 35. On the other hand, with the light emitting device of Comparative example 2 in which dry film resist was used, the resist film failed to have a desired shape and thickness at the corner portions and end surface of the metal part 35.

It is to be understood that although certain embodiments of the present disclosure have been described, various other embodiments and variants may occur to those skilled in the art that are within the scope and spirit of the invention, and such other embodiments and variants are intended to be covered by the following claims.

What is claimed is:

1. A method of manufacturing a light emitting device which comprises:
   providing a first structure having a lead frame and a resin molded body which includes the following steps:
      providing a metal plate including a plurality of pairs of first and second metal parts, each of the first and second metal parts including an upper surface, a lower surface, an end surface, and a first region including the end surface and at least part of the upper surface, wherein the end surface of the first metal part and the end surface of the second metal part of each pair oppose each other,
      disposing a mask of a resist film on the first region by using an electrodeposition technique,
      using a plating technique to dispose a first plated layer containing gold or gold alloy on a second region which includes at least part of the upper surface and at least part of the lower surface other than the first region, and on at least one of the upper surface, the lower surface, and the end surface of each of the first and second metal parts, and
      removing the resist film to produce the lead frame,
   providing a resin molded body molded integrally with the lead frame with parts of a lower surface of the lead frame being exposed,
      wherein, the first structure includes an upper surface defining a plurality of recesses each having an upward-facing surface, the first plated layer on the upper surface of the metal part is located at the upward-facing surface of each of the plurality of recesses; and
   providing a second structure having at least one light-emitting element and sealing member which includes the following steps:
      disposing at least one light-emitting element on the upward-facing surface each of the plurality of recesses,
      disposing a sealing member covering the at least one light-emitting element in each of the plurality of recesses; and
      separating the second structure into a plurality of discrete light emitting devices,
   wherein the end surface of the first metal part which is paired with the second metal part has a first projection P which is located closer to the second metal part than the upper surface of the first metal part and the lower surface of the first metal part, and
   at least a part of the first projection P is exposed from the first plated layer.

2. The method according to claim 1, wherein
a first plated layer is disposed, using the plating technique, on the upper surface of each of the first and second metal parts; and
the resin molded body is formed integrally with the lead frame.

3. The method according to claim 1, wherein
each of the first and second metal parts includes:
   a first corner portion connecting the upper surface and the end surface of each of the first and second metal parts, and
   a second corner portion connecting the lower surface and the end surface of each of the first and second metal parts, and
the resist film continuously covers the end surface of each of the first and second metal parts and at least one of the first corner portion and the second corner portion.

4. The method according to claim 1, wherein
the resist film is disposed on surfaces including the upper surface, the lower surface, the end surface, and corners of each of the first and second metal parts;
the resist film disposed on the first and second metal parts is dried;

light is irradiated on respective portions of the resist film located in the second region to render the respective portions of the resist film located in the second region soluble to a developer solution;
portions of the resist film located in the second region are removed using the developer solution; and
after the first plated layer is disposed, portions of the resist film located in the first region is removed using a resist-removing solution.

5. The method according to claim 1, wherein the first plated layer containing gold or gold alloy has a thickness of 10 nm or greater.

6. The method according to claim 1, wherein the first plated layer covers the entire upper surface of each of the metal parts at the upward-facing surface of each of the recesses.

7. The method according to claim 1, wherein the first plated layer contains at least 85% of gold or gold alloy by mass.

8. The method according to claim 1, wherein the gold alloy of the first plated layer is gold-silver alloy, gold-indium alloy, gold-palladium alloy, gold-cobalt alloy, gold-nickel alloy, or gold-copper alloy.

9. The method according to claim 1, wherein
the end surface of the second metal part which is paired with the first metal part has a second projection P which is located closer to the first metal part than the upper surface of the second metal part and the lower surface of the second metal part, and
at least a part of the second projection P is exposed from the first plated layer.

10. The method according to claim 1, wherein
the first metal part of the lead frame has at least part of the end surface of the first metal part opposed to the end surface of second metal part exposed from the first plated layer, at least part of the upper surface of the first metal part exposed from the first plated layer and a first corner portion connecting the upper surface and the end surface of the first metal part exposed from the first plated layer.

11. The method according to claim 1, wherein the first plated layer covers a portion of the upper surface of each of the metal parts at the bottom surface of each of the recesses.

12. The method according to claim 11, wherein
the at least one light emitting element is connected to a single pair of metal parts via respective wires or via a bonding member, and
the first plated layer covers, in the upper surface of each of the metal parts, a disposing region where the respective wires or the bonding member is disposed.

13. The method according to claim 1, wherein
a second plated layer between the upper surface of each of the metal parts and the first plated layer is formed on the lead frame, and
the second plated layer covers the first region.

14. The method according to claim 13, wherein the second plated layer includes at least one metal layer containing copper, copper alloy, nickel, nickel alloy, palladium, palladium alloy, rhodium, or rhodium alloy.

15. The method according to claim 13, wherein the second plated layer covers the second region.

16. The method according to claim 13, wherein a content of gold or gold alloy in the second plated layer is 0.05 mass percent or less.

17. The method according to one of claim 1, wherein
the resist film is disposed on surfaces including the upper surface, the lower surface, the end surface, and corners of each of the first and second metal parts;
the resist film disposed on the first and second metal parts is dried;
light is irradiated on respective portions of the resist film located in the first region to render the respective portions of the resist film located in the first region insoluble to a developer solution;
portions of the resist film located in the second region are removed using the developer solution; and
after the first plated layer is disposed, portions of the resist film located in the first region is removed using a resist-removing solution.

18. The method according to claim 17, wherein
light is irradiated on the respective portions of the resist films from above, below, or above and below the metal plate, and
the light is irradiated through a light-shielding mask, or is emitted from an irradiation device configured to emit light of a predetermined pattern.

19. The method according to claim 18, wherein
in a cross-sectional view perpendicular to the upper surface of each of the pairs of first and second metal parts,
a first corner portion connecting the upper surface and the end surface of the first metal part is located closer to the second metal part than a second corner portion connecting the lower surface and the end surface of the first metal part, and
light is irradiated on the respective portions of the resist films, from below the metal plate with an end of the light-shielding mask or as an end of the light of the predetermined pattern in conformity to a location between the first corner portion and the second corner portion of the first metal part.

20. A method of manufacturing a light emitting device which comprises:
providing a first structure having a lead frame and a resin molded body which includes the following steps:
providing a metal plate including a plurality of pairs of first and second metal parts, each of the first and second metal parts including an upper surface, a lower surface, an end surface, and a first region including the end surface and at least part of the upper surface, wherein the end surface of the first metal part and the end surface of the second metal part of each pair oppose each other,
disposing a mask of a resist film on the first region by using an electrodeposition technique,
using a plating technique to dispose a first plated layer containing gold or gold alloy on a second region which includes at least part of the upper surface and at least part of the lower surface other than the first region, and on at least one of the upper surface, the lower surface, and the end surface of each of the first and second metal parts, and
removing the resist film to produce the lead frame,
providing a resin molded body molded integrally with the lead frame with parts of a lower surface of the lead frame being exposed,
wherein, the first structure includes an upper surface defining a plurality of recesses each having an upward-facing surface, the first plated layer on the upper surface of the metal part is located at the upward-facing surface of each of the plurality of recesses; and providing a second structure having at least one light-emitting element and sealing member which includes the following steps:

disposing at least one light-emitting element on the upward-facing surface each of the plurality of recesses, disposing a sealing member covering the at least one light-emitting element in each of the plurality of recesses; and separating the second structure into a plurality of discrete light emitting devices, wherein the first metal part of the lead frame has at least part of the end surface of the first metal part opposed to the end surface of second metal part exposed from the first plated layer, at least part of the upper surface of the first metal part exposed from the first plated layer and a first corner portion connecting the upper surface and the end surface of the first metal part exposed from the first plated layer.

\* \* \* \* \*